US010910991B2

(12) United States Patent
Valinejadshoubi et al.

(10) Patent No.: US 10,910,991 B2
(45) Date of Patent: Feb. 2, 2021

(54) MULTIFUNCTIONAL SOLAR SYSTEM FOR GENERATING ELECTRICITY, USEFUL HEAT, AND VENTILATION IN BUILDINGS

(71) Applicants: Masoud Valinejadshoubi, Mazandaran (IR); Mannan Ghanizadehgrayli, Mazandaran (IR)

(72) Inventors: Masoud Valinejadshoubi, Mazandaran (IR); Mannan Ghanizadehgrayli, Mazandaran (IR)

(*) Notice: Subject to any disclaimer, the term of this patent is extended or adjusted under 35 U.S.C. 154(b) by 23 days.

(21) Appl. No.: 16/143,415

(22) Filed: Sep. 26, 2018

(65) Prior Publication Data
US 2019/0068117 A1 Feb. 28, 2019

(51) Int. Cl.
*H02S 40/44* (2014.01)
*H02S 20/22* (2014.01)
(Continued)

(52) U.S. Cl.
CPC ............... *H02S 40/44* (2014.12); *E06B 9/00* (2013.01); *F24S 20/63* (2018.05); *F24S 60/10* (2018.05);
(Continued)

(58) Field of Classification Search
CPC .. F24S 20/63; F24S 20/66; F24S 80/20; F24S 80/30; F24S 10/20; F24S 2020/17;
(Continued)

(56) References Cited

U.S. PATENT DOCUMENTS 3,994,276 A * 11/1976 Pulver ....................... F24D 5/04
126/616
4,043,316 A 8/1977 Arent
(Continued)

FOREIGN PATENT DOCUMENTS

GB 2493092 A * 1/2013 ............. H02S 40/00
WO WO-2012069217 A1 * 5/2012 ............. C09K 5/063

OTHER PUBLICATIONS

WO-2012069217-A1 English machine translation (Year: 2012).*

*Primary Examiner* — Andrew J Golden
(74) *Attorney, Agent, or Firm* — NovoTechIP International PLLC

(57) ABSTRACT

A solar window system for a building includes multiple heat generation encasements each including thermoelectric sheets, where the thermoelectric sheets are positioned inside a housing having an interior metal layer. Air inside each heat generation encasement is heated by solar energy. Inside each heat generation encasement, there are pipes filled with Phase-Change Material (PCM) materials that help provide heating to the building. The solar window system further includes a storage tank on top of the system filled with PCM materials for storing heat from the heated air, the storage tank being connected to the pipes of each heat generation encasement. The solar window system includes a set of connection pipes, wherein the set of connection pipes draw cold air from an indoor space inside the building into the plurality of heat generation encasements, connect each of the heat generation encasements to at least two other heat generation encasements, and transfer the heated air from the set of heat generation encasements to the storage tank. The solar window system also includes circular movable rings that can be open and closed as needed. These rings are located around each heat generation encasement and have two movable flexible solar panels capable of generating electricity.

16 Claims, 28 Drawing Sheets

(51) Int. Cl.
    *H01L 35/30*     (2006.01)
    *F24S 80/30*     (2018.01)
    *F24S 60/10*     (2018.01)
    *F24S 80/20*     (2018.01)
    *F24S 20/63*     (2018.01)
    *H02S 10/10*     (2014.01)
    *H02S 20/26*     (2014.01)
    *F24S 80/52*     (2018.01)
    *E06B 9/00*     (2006.01)
    *H02S 40/42*     (2014.01)

(52) U.S. Cl.
    CPC ............... *F24S 80/20* (2018.05); *F24S 80/30* (2018.05); *F24S 80/52* (2018.05); *H01L 35/30* (2013.01); *H02S 10/10* (2014.12); *H02S 20/22* (2014.12); *H02S 20/26* (2014.12); *H02S 40/425* (2014.12)

(58) Field of Classification Search
    CPC ........ H02S 40/44; H02S 40/425; H02S 20/22; H02S 20/26; H02S 30/20; H01L 31/0525; F24H 2240/08; F24H 2240/09
    USPC ......................................................... 136/206
    See application file for complete search history.

(56) References Cited

U.S. PATENT DOCUMENTS

| | | |
|---|---|---|
| 5,217,000 A | 6/1993 | Pierce-Bjorklund |
| 9,038,709 B2 | 5/2015 | Bank et al. |
| 9,624,719 B2 | 4/2017 | Rupel |
| 9,702,185 B2 | 7/2017 | Jelic et al. |
| 2010/0330898 A1* | 12/2010 | Daniels ................... E04D 13/17 454/365 |
| 2011/0088753 A1* | 4/2011 | Ahlgren .................. H02S 40/44 136/246 |
| 2012/0227926 A1 | 9/2012 | Field et al. |
| 2013/0118478 A1* | 5/2013 | Armstrong .............. F24S 10/30 126/643 |
| 2013/0319504 A1 | 12/2013 | Yang et al. |
| 2013/0327371 A1* | 12/2013 | Hui ......................... H02S 30/20 136/245 |
| 2014/0224295 A1* | 8/2014 | Yazawa ................. H02S 40/425 136/206 |
| 2018/0066870 A1 | 3/2018 | Valinejadshoubi et al. |

\* cited by examiner

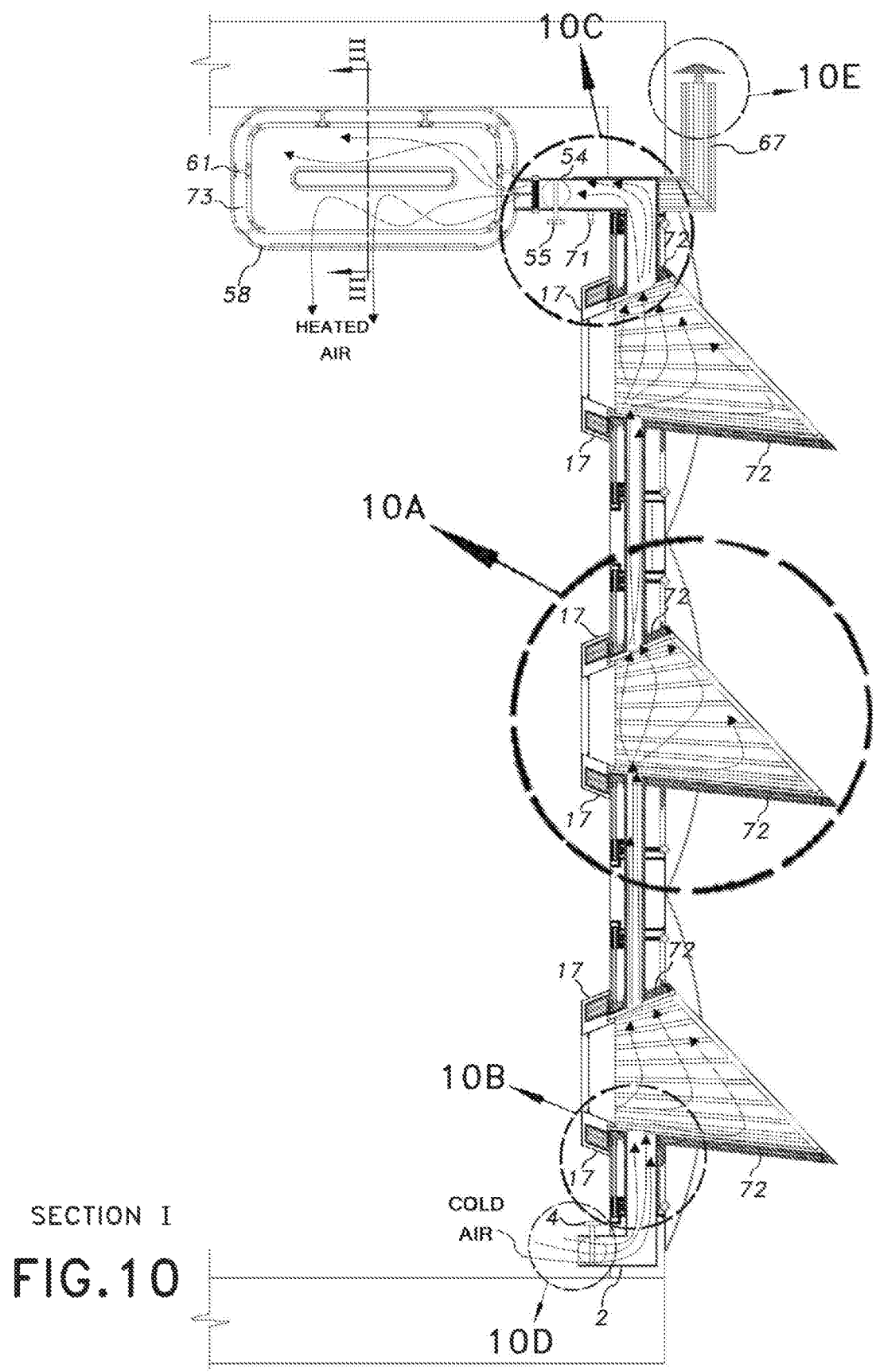

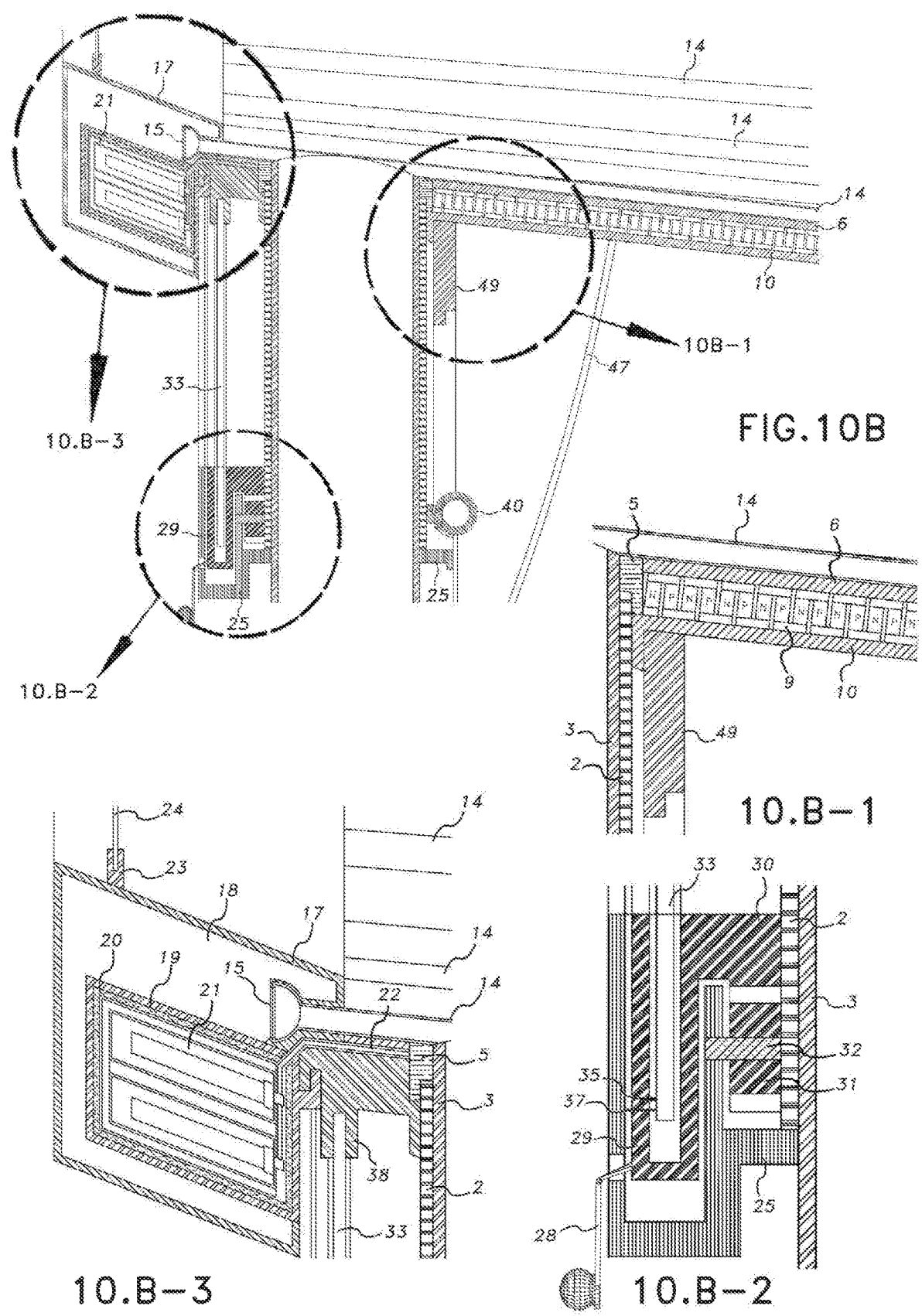

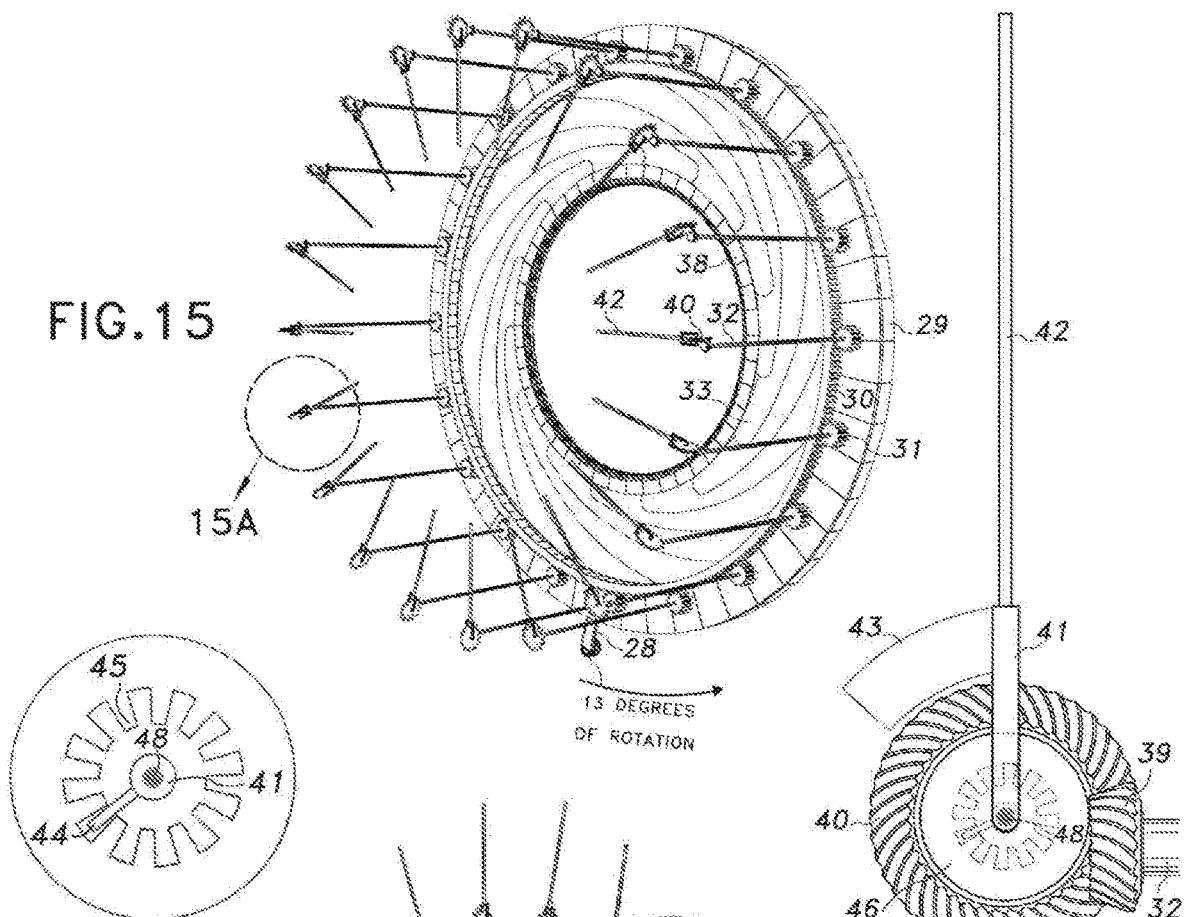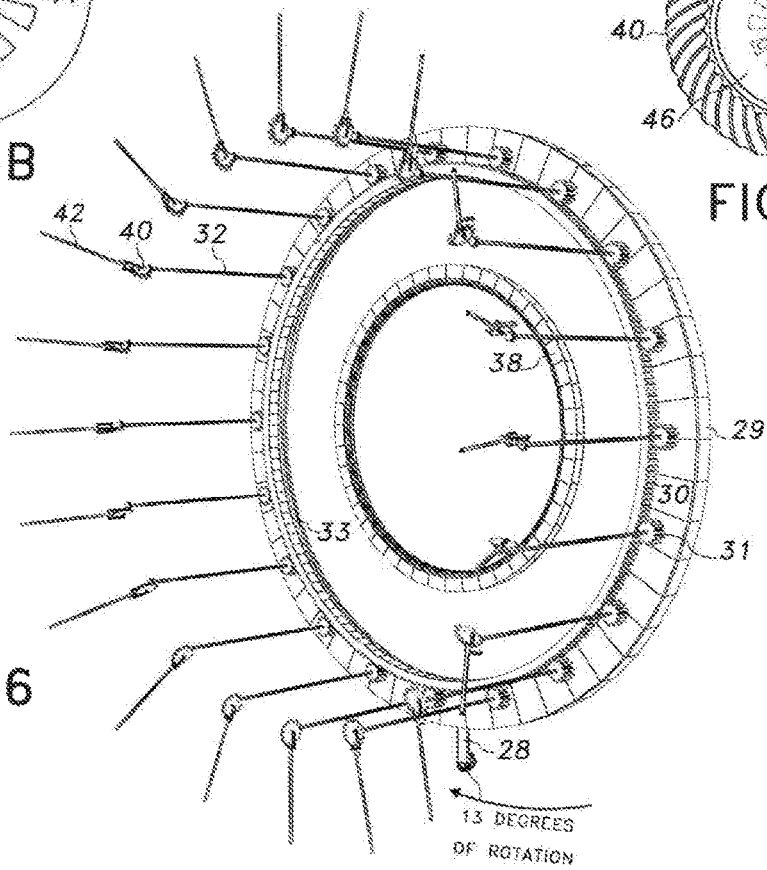

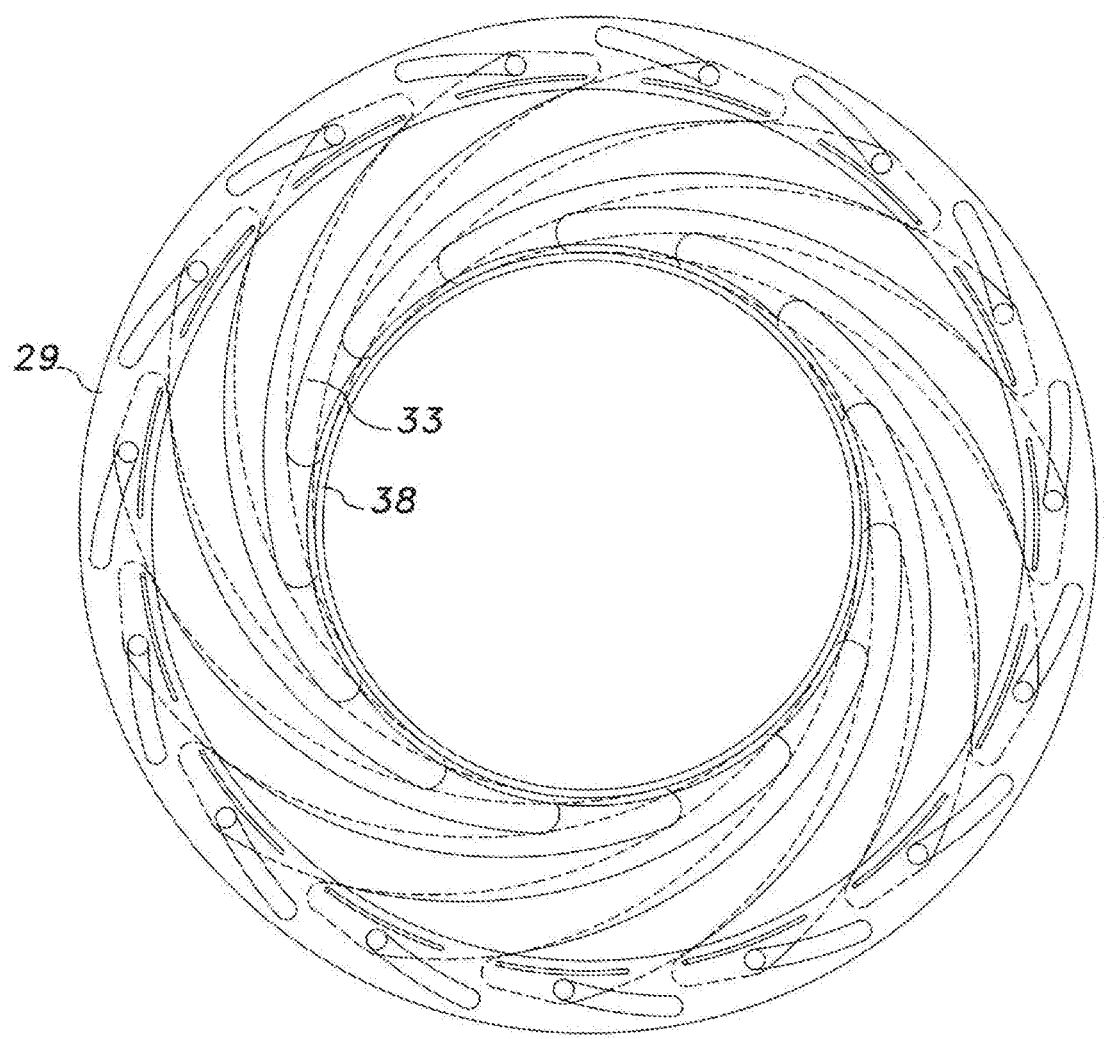
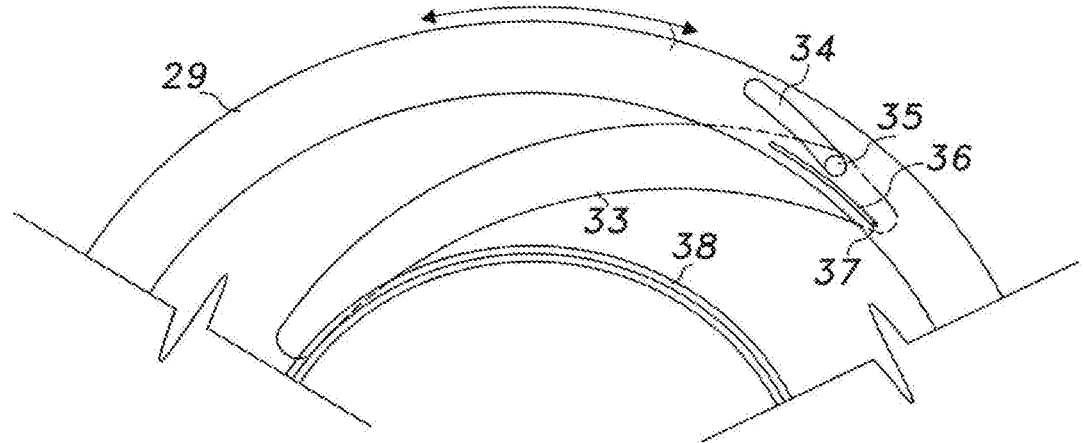
FIG.21

SECTION II

13 DEGREES OF ROTATION

SECTION III

MULTIFUNCTIONAL SOLAR SYSTEM FOR GENERATING ELECTRICITY, USEFUL HEAT, AND VENTILATION IN BUILDINGS

CROSS REFERENCE TO RELATED APPLICATION

This application claims the benefit of priority to an Iran patent application having serial number 139650140003009967, which was filed on Nov. 20, 2017, and is incorporated by reference herein in its entirety

TECHNICAL FIELD

The present application relates generally to harnessing solar energy and, more particularly, to a solar window system for providing light to indoor spaces, generating and storing solar-generated electricity and using solar radiation for providing heated air, air conditioning, air filtration, and air circulation using a solar chimney and a kinetic structure.

BACKGROUND

Renewable sources of energy such as sunlight provide opportunities for conservation of energy in various geographic areas. This type of energy coming from natural resources provides environment-friendly energy. As the amount of reserves of fossil fuel decreases, production cost of fossil energy increases. On the other hand, with increase in world population, consumption of fossil fuel endangers the environment with increased pollution and contributes to global warming. Increase in the amount of greenhouse gases is causing climate change.

Solar energy is one of the cheapest and most available renewable energies. However, a small percentage of the total world energy consumption is produced using solar energy. In recent years, new applications of solar energy are implemented with the hope of achieving environmental stability. One of the applications of solar energy is using solar energy for heating indoor spaces. Solar energy provides light and heat. However, known systems using solar energy usually produce either heat or light from the solar energy. Heat production from solar energy has attracted more attention than light production. Statistical data suggest that 20 to 50 percent of energy consumption in residential and commercial buildings is for lighting purposes. In some cases, savings in energy used for lighting buildings may cause up to 80 percent lower energy consumption. In addition to heat and light, sunlight can disinfect air and surfaces and improve emotional health and wellbeing of residents.

Most known solar heaters currently used are single purpose and generate either heat or lighting from solar energy. These known systems include devices installed in buildings in addition to the typical building components and do not provide air filtration, air circulation, generating electricity or air conditioning.

Therefore, there is a need for an improved system which provides lighting to a building, heat in cold weather, air filtration, air conditioning and cooling in hot weather from solar energy, provides storage of the generated heat for future use or release of the extra heat via solar chimneys, and generates electricity in various conditions.

SUMMARY

A solar window system for a building is provided. In one implementation, the system includes a plurality of heat generation encasements, wherein air inside each heat generation encasement is heated by solar energy, one or more pipes filled with phase-change materials (PCM) attached to each heat generation encasement, wherein the PCM is heated by solar energy, one heat storage tank for each heat generation enactment for receiving heat from the PCM material of the one or more pipes, and releasing the heat inside the building when needed; a storage reservoir located on an upper portion of the solar window system for storing the heated air from inside each heat generation encasement, releasing the heated air into the building when needed, and a set of connection pipes, wherein the set of connection pipes are configured to draw cold air from an indoor space inside the building into the plurality of heat generation encasements, and transfer the heated air from the plurality of heat generation encasements to the storage reservoir. Each heat generation encasement may include at least one thermoelectric sheet for generating electricity.

BRIEF DESCRIPTION OF THE DRAWINGS

Features of the subject technology are set forth in the appended claims. However, for purpose of explanation, several implementations of the subject technology are set forth in the following figures.

FIG. 10 illustrates a schematic of a side view of one section of the solar window system and the way air flows through the system.

FIGS. 10A-10B-10B_1-10B_2-10B_3 illustrate schematics of a heat generation encasement that forms part of the solar window system.

FIGS. 15, 15A-15B, and 16 illustrate rods and gears that open and close the flexible solar panels of the heat generation encasement that forms part of the solar window system.

FIG. 21-22 illustrate the movement of movable vents on the heat generation encasement that forms part of the solar window system in both closed and open positions.

DETAILED DESCRIPTION

Figure 1:
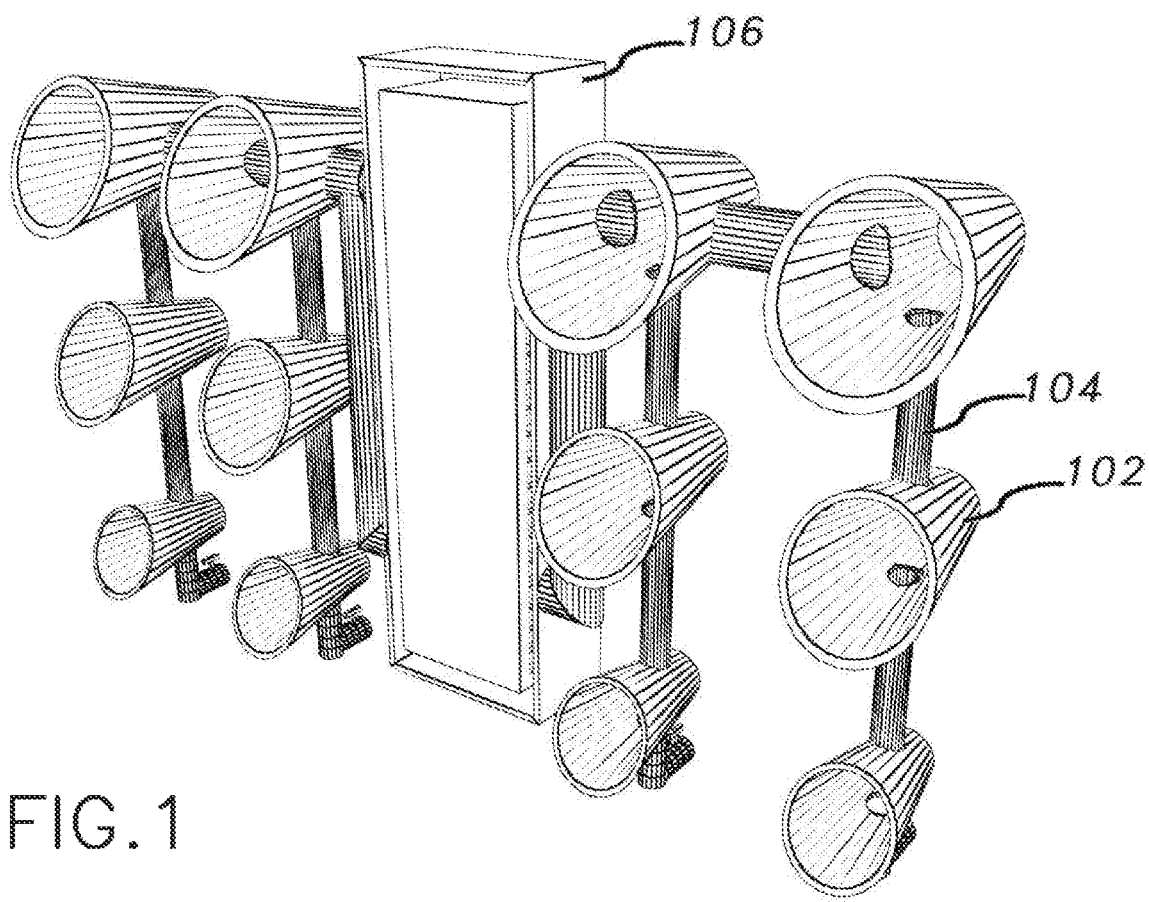
FIGS. 1-4 are schematics of heat generating solar windows disclosed by prior art.

In the following detailed description, numerous specific details are set forth by way of examples in order to provide a thorough understanding of the relevant teachings. However, it should be apparent to those skilled in the art that the present teachings may be practiced without such details. In other instances, well-known methods, procedures, components, and/or circuitry have been described at a relatively high-level, without detail, in order to avoid unnecessarily obscuring aspects of the present teachings.

FIGS. 1-4 illustrate a heat generating solar window disclosed by prior art. The solar heat generating solar window includes a set of housing units 102, a set of pipes 104, and a storage tank 106. The heat generating solar window can be integrated into the wall of a building. To this end, the housing unit 102 can be distributed across one or more of walls of the building. The building may be any residential or commercial building. The housing unit 102 is cylindrical shaped and is configured to receive cold air from the one or more of sets of pipes 104 located toward the back of the system. Cold air is heated within the housing unit 102 and the heated air is then transferred to the storage tank 106 via one of the sets of pipes 104.

The housing unit 102 includes two glass sheets, a metal absorber, an insulator, and a ceramic cover. One of the two glass sheets is located at one end of the housing unit 102 and the other is located at the other end of the housing unit 102, allowing the light to enter the housing unit and heat the metal absorber. The metal absorber covers the insulator, which in turn covers the ceramic cover of the housing unit 102. The insulator prevents or reduces heat transfer from the metal absorber to the ceramic cover.

Once the cold air inside the housing unit 102 is heated, it may be transferred to the storage 106. The storage 106 may receive the heated air through the pipes 104. The pipes 104 may have several control valves. The control valves may include a cold air entrance control valve and a hot air exit control valve. The cold air entrance control valve controls the entrance of the cold air into the solar window system. It may be located on the pipes 104 toward the bottom of the system. If hot air is not needed, this valve may be closed to shut down the entrance of cold air to the system. The hot air exit control valve may be placed on the pipes 104 located adjacent to the storage 106. If closed, the exit control valve could prevent hot air from the housing unit 102 to enter the storage 106. If opened, it would allow hot air from the housing unit 102 to enter the storage 106.

The storage 106 includes several housings. The outer housing 108 is made of Polyvinyl chloride (PVC) and is configured to collect the heated air via the absorbers in the housing unit 102 and transfer the heated air to the central part of the storage 106. The inner housing 110 includes holes within its body and is configured to draw the heated air stored in the outer housing 108 to inside of the inner housing 110. Inside the inner housing 110, a set of stones 112 may be located which may be heated as a result of this heat transfer. The inner housing 110 is also made of PVC so the heat does not escape from the interior of the inner housing 110.

The exit door from the storage 106 is made of two layers. The first layer 114 includes holes for transferring the heated air from inside of the inner housing 110 to inside of the building. The second layer 116 is an insulator that is configured to slide over the first layer 114 and cover the holes of the first layer 116 to prevent the heated air from escaping the inner housing 110. The storage 106 is placed inside the wall of the building. To this end, the storage 106 is covered by a first wall 118 on one side and on another side, it is covered by a second wall 120. Between the first wall 118 and the second wall 120, an insulator 122 may be placed. The pipes 104 are also placed inside of the wall between the first wall 116 and the second wall 118.

The housing units 102 may not all be of the same size. In one specific example, the housing units 102 placed on the upper side of the solar window system may be larger than the housing units 102 placed on a lower side of the solar window system.

The prior art heat generating solar windows depicted in FIGS. 1-4 provide a solar heating system for use in buildings. Although these windows provide a mechanism by which solar energy can be used to heat a building, they are limited in the functions they provide. For example, they may block windows thereby acting as a visual barrier and preventing sunlight from entering a building. Moreover, they do not provide a solution for filtration of heated air or production and storage of electric energy.

A solution is proposed here to solve these issues and more by providing a multi-functional air heater and natural ventilator device that corresponds to changing climate conditions by offering heating, cooling and natural ventilation, sunlight, air purification, and producing and storing electric energy. In one embodiment, the system also provides efficient storage of heated air by providing an insulated storage tank which utilizes phase change materials (PCM). In order to produce and store electrical energy, the air inlets and vents of the system that are provided for ventilation when open, are made of flexible solar panels. Moreover, by using interconnected thermoelectric cells, generated electrical energy can be stored for various future uses. The solar window system can be installed in the building during construction to become a part of the building wall.

The solar window system may include main components such as, for example, a set of heat generation encasements installed on walls of a building such that air inside each heat generation encasement is heated by solar energy; a storage tank for storing the heated air; a set of connection pipes to draw cold air from an indoor space inside the building into the heat generation encasements, and transfer the heated air from the heat generation encasements to the storage tank; and openings around the heat generation encasements which are formed on the outer side from flexible solar panels and on the inner side from movable vents, where the flexible solar panels generate electricity.

Figure 5:
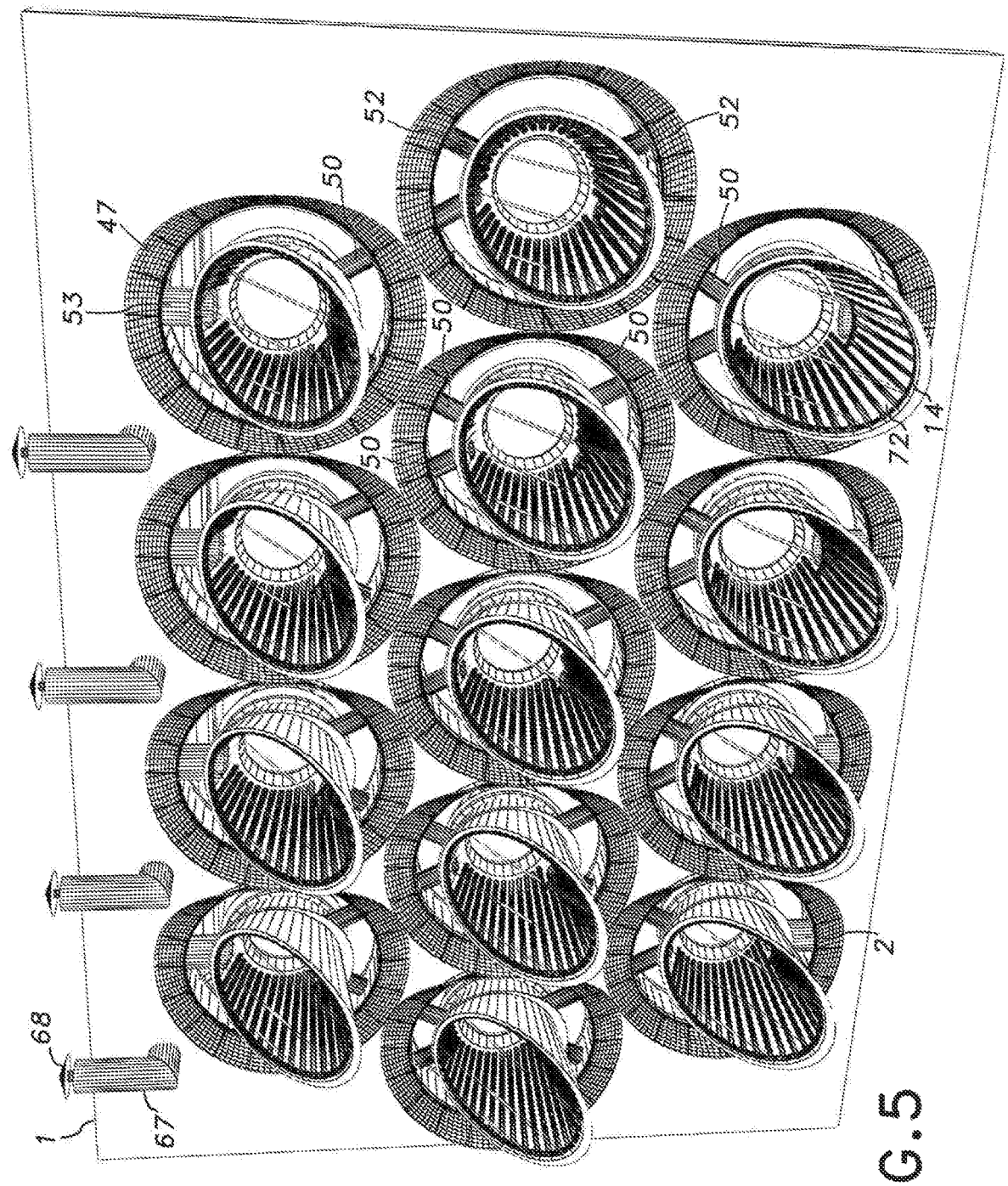
FIGS. 5-9 are schematics of components of a solar window system.
Figure 6:
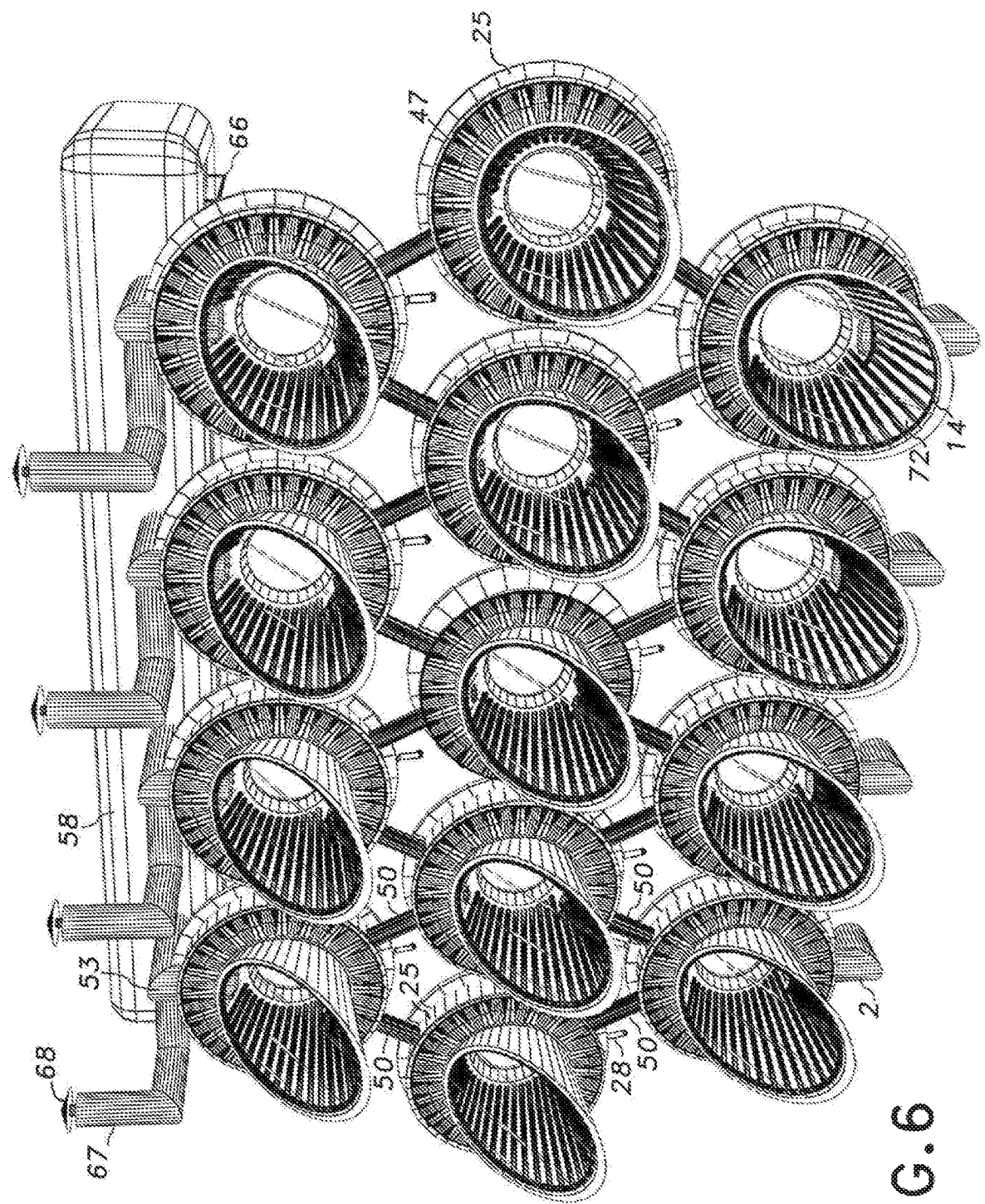

The solar window system may include multiple window openings or heat generation encasements shown as 72 in FIGS. 5-9. Moreover, each heat generation encasement 72 can be cylindrical in shape and made from thermoelectric materials covered with glass sheets on both ends, with an angular cut on the end to provide an angle towards the sunlight such that a highest possible amount of solar energy is absorbed. As shown in FIG. 5, a set of heat generation encasements can be installed on a wall 1 surface to provide heat, light, solar generated electricity and air conditioning to the indoor space surrounded by the wall. The wall can be constructed in the same manner as commonly done in previously constructions while making us of the solar window system.

Figure 18:
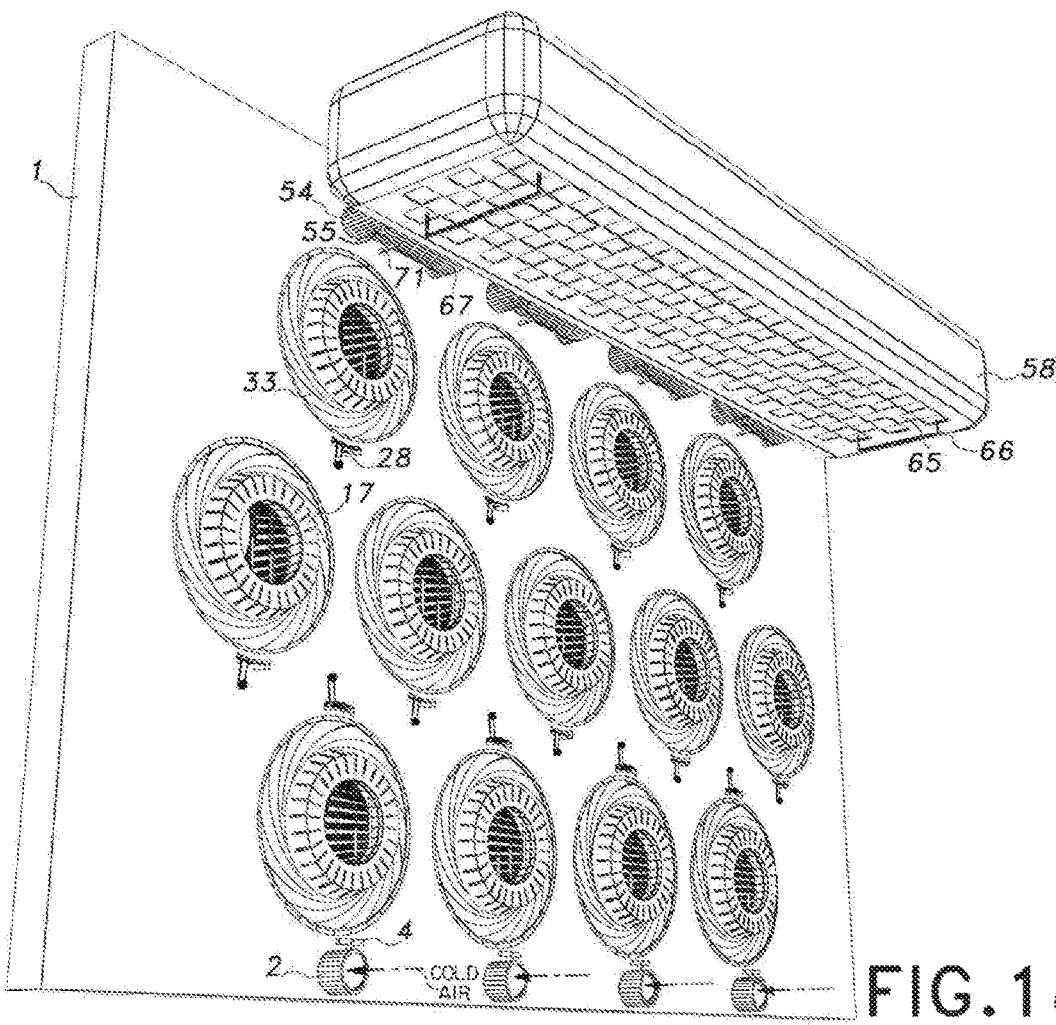
FIG. 18 is a schematic of a view of the solar window system from inside a building.

A heat generation encasement 72 may include various components such as, for example, anti-reflective glass (shown as 13 and 24 in FIG. 10A) on both ends of the heat generation encasement 72, a thermoelectric sheet (shown as 72 in FIG. 10), where the interior side of the thermoelectric sheet covers the internal surface 6 of the heat generation encasement, and one or more pipes filled with PCM (shown as 14 in FIG. 10A), which are installed on the surface of the thermoelectric sheet. The internal surface 6 of the heat generation encasement 72 receives solar energy and heats the air inside the heat generation encasement 72. Moreover, the thermal difference created between the internal surface 6 and external surface 10 of the thermoelectric enclosure, generates electricity. The PCM filled pipes cause the air inside the heat generation encasement 72 to be heated and store the generated heat. The presence of these pipes inside the heat generation encasement 72 causes the system to have the same high and constant efficiency throughout the day due to the presence of PCM materials. A storage tank for these pipes (shown as 17 in FIGS. 9 and 10 and 18 in FIG. 10A) is located on the side of the heat generation encasement 72 with access to the inside of the building. The heat storage tank 17 is filled with PCM and is heated by the pipes to which it is attached.

Flexible solar panels (shown as 47 in FIGS. 5 to 9) are located on the outer side of the heat generation encasement 72. These flexible solar panels are movable and can be opened and closed, and they care capable of generating electricity in both the open and closed positions. Movable vents (shown as 33 in FIGS. 18 and 19) are located on the inner side of the heat generation encasement 72 of the window and are opened and closed with the flexible solar panels surrounding each heat generation encasement 72. The opening and closing of the vents 33 and the solar panels 17 can be done by a movable arm located inside the system (shown as 28 in FIGS. 18 and 19).

Both ends of the heat generation encasements 72 can be covered with anti-reflective glass such that a maximum possible amount of the sunlight reaches the metal sheet and to prevent the generated heat to escape the heat generation encasement. The anti-reflective glass can be a glass with 3-millimeter thickness and the anti-reflective property of the glass can be provided by coating the glass with nano materials (e.g., Nano-coating).

The light waves reaching a sheet of glass are partly absorbed, partly passed through and partly reflected. Experiments have shown that a clean and colorless glass reflects less light than a dirty or colored glass. It has been shown that clean glass can pass 70 percent more light than a dirty glass. Thus, for increasing the amount of light absorbed by the solar window system, the reflection of light should be decreased, while the amount of light passing through the glass is increased.

Nano-technology provides anti-reflective materials. For example, a thin layer of porous silica can be attached to glass to provide anti-reflective (AR) property for the glass. The AR layer can increase glass clarity up to 98 percent. In addition, the AR glass may have anti-static property, which can prevent absorption of debris to the glass due to static electricity. As a result, the amount of heat generation from solar energy can be increased by up to 15 percent. The glass can be attached to both ends of each heat generation encasement 72. Glass sheets with a thickness such as 3 millimeters, can be used and installed on the heat generation encasement 72 by using a compressed plastic frame with high strength.

The interior layer of the thermoelectric sheet (shown as 6 in FIGS. 10B and 10B-1) can be heated by sunlight which can raise air temperature inside of the encasement 72 to generate hot air. The hot air expands due to heat and moves upward into other heat generation encasements 72 via connection pipes 50 shown in FIGS. 5-7 and 9. To produce electric energy using the thermoelectric sheet, one side of the thermoelectric sheet should be warm, while another side stays cold, such that the difference in temperature can produce electrical energy. The heated side of the thermoelectric sheet (shown as 6 in FIGS. 10B and 10B-1) is inside the heat generation encasement 72, while the cold side (shown as 10 in FIGS. 10B and 10B-1) is outside the heat generation encasement 72. Electric energy is generated via a thermodynamic generator through a heat flow between two points with different temperatures. With the flow of heat from the hot side to the cold side, free charge carriers (electrons) in the material are also driven toward the cooler side. The generated voltage (V) is proportional to the temperature difference ($\Delta T$) through the coefficient of $\alpha$ ($V=\alpha\Delta T$). By connecting a conductive electron material (semiconductor type n) (FIG. 10B-1) and a conductive cavity (semiconductor type p) (FIG. 10B-1), a voltage is obtained that can generate electric power. Therefore, in order to create a voltage, several pairs of thermoelectric materials must be connected in series to form a thermoelectric generator.

Figure 9:
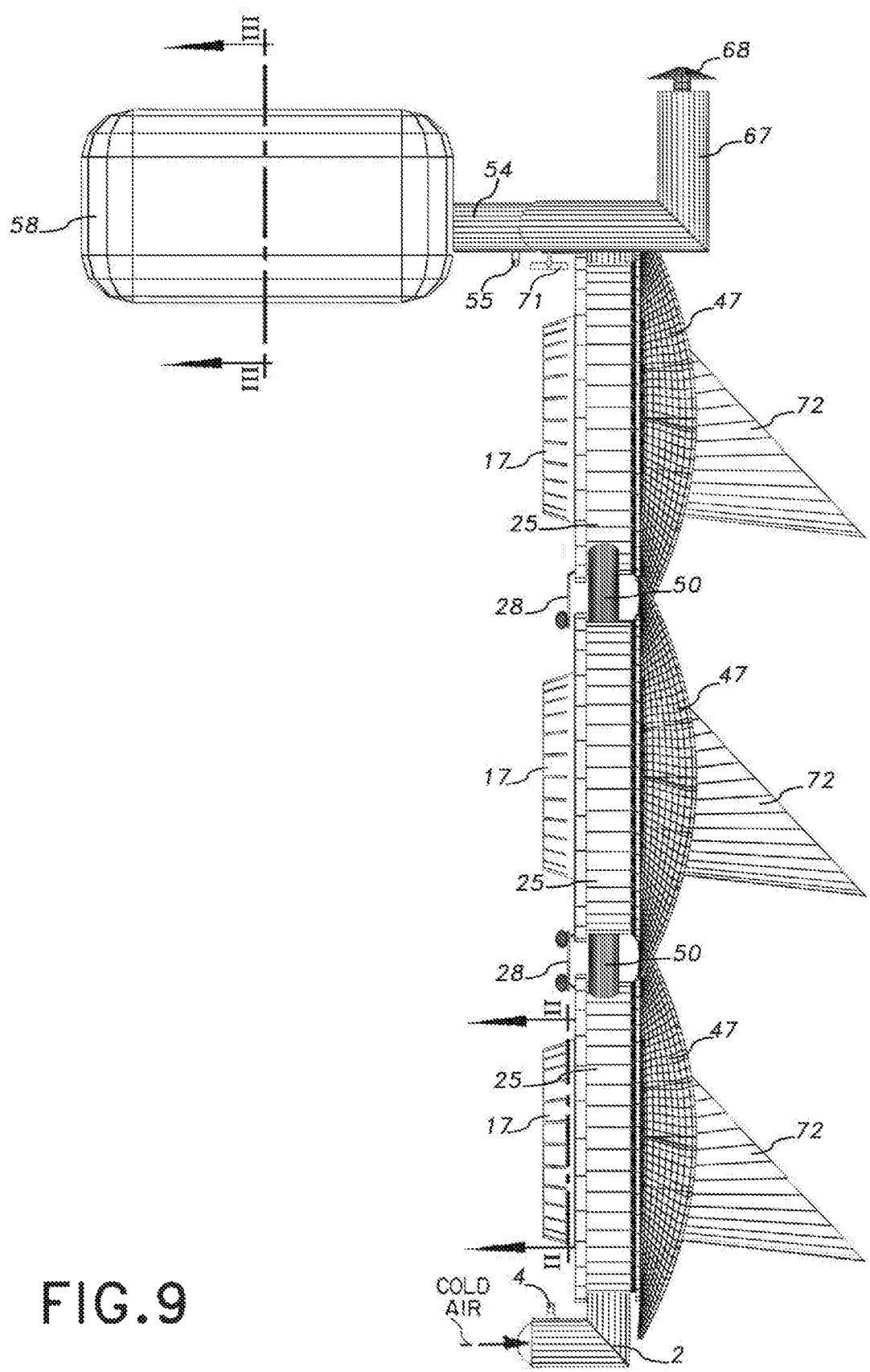

As shown in FIGS. 9-10, a thermoelectric heat generation encasement 72 can be positioned towards the sunlight with an angel determined based on the geographical location of the building. The angular position of the thermoelectric heat generation encasements against the sunlight can affect the amount of solar energy entering the solar window system. The angular position of the thermoelectric heat generation encasements can be adjustable and adjusted based on the geographical location of installation.

The interior metal layer of the thermoelectric sheet (shown as 6 in FIGS. 10B and 10B-1) can be made from metals with dark and/or matte colors because dark and matte surfaces can be heated up to 39 degrees centigrade more than light and shiny-colored surfaces. Metals previously used as heat absorption layers include, copper, iron, galvanized pipes, aluminum, steel and bronze. Copper has a higher thermal conductivity than other metals. In addition, copper corrosion can easily be prevented.

Figure 10A:
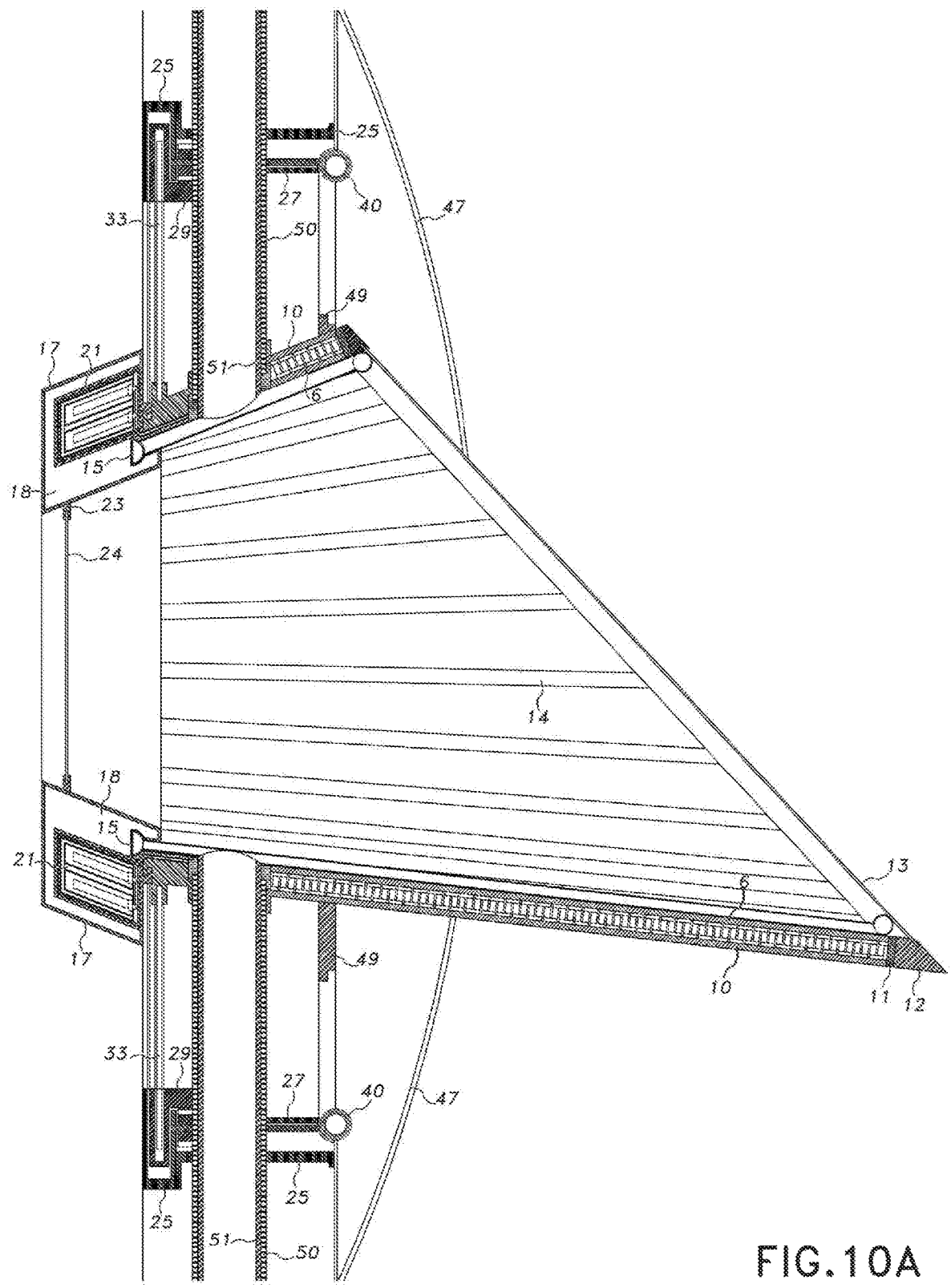
Figure 10C:
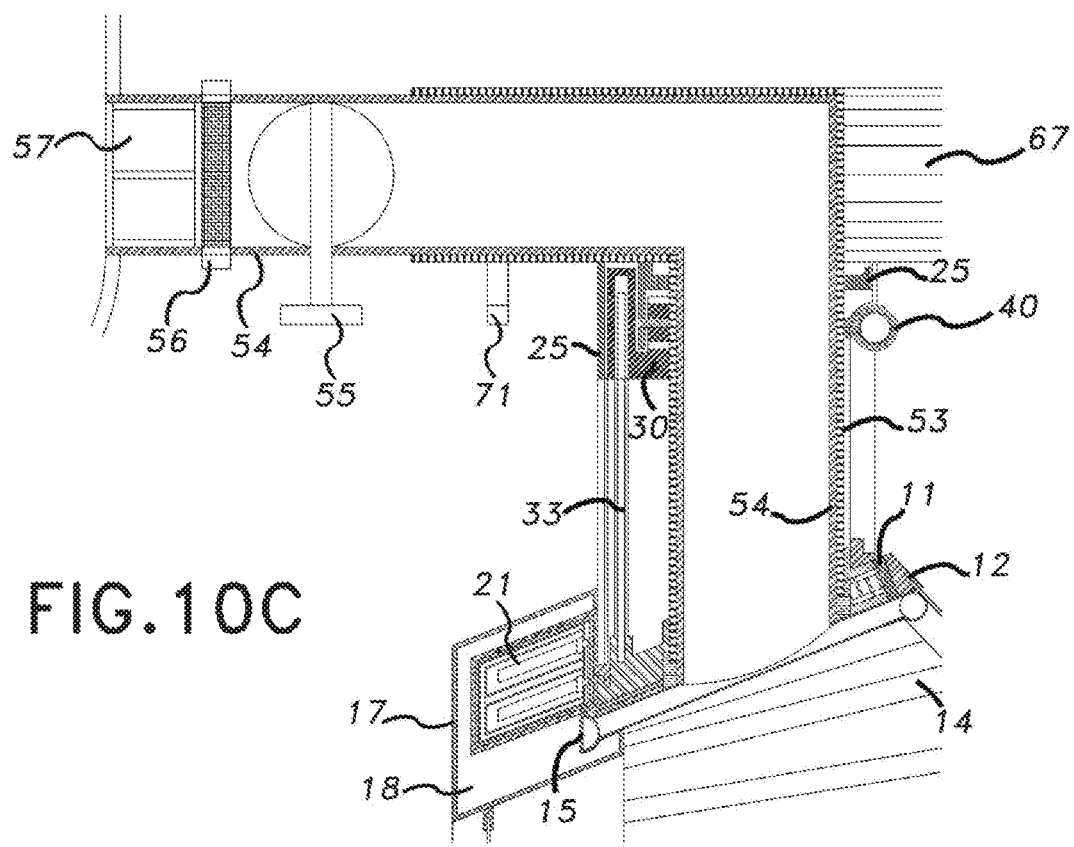
FIG. 10C is a schematic of a portion of the solar window system that illustrates the flow of heated air into a storage reservoir.

Item 11 in FIG. 10A shows an expansion gap. The interior metal layer of the thermoelectric sheet may expand upon heating and the expansion may cause damage to other components of heat generation encasement 72. The expansion gap 11 can prevent damage to the glass and/or the glass and glass frame due to the expansion of the interior metal layer of the thermoelectric sheet. The expansion gap 11 can be provided as a gap between the interior metal layer of the thermoelectric sheet and the glass and filled with a flexible insulator such as plastic or cork to absorb the expansion force of the metal.

Figure 24:
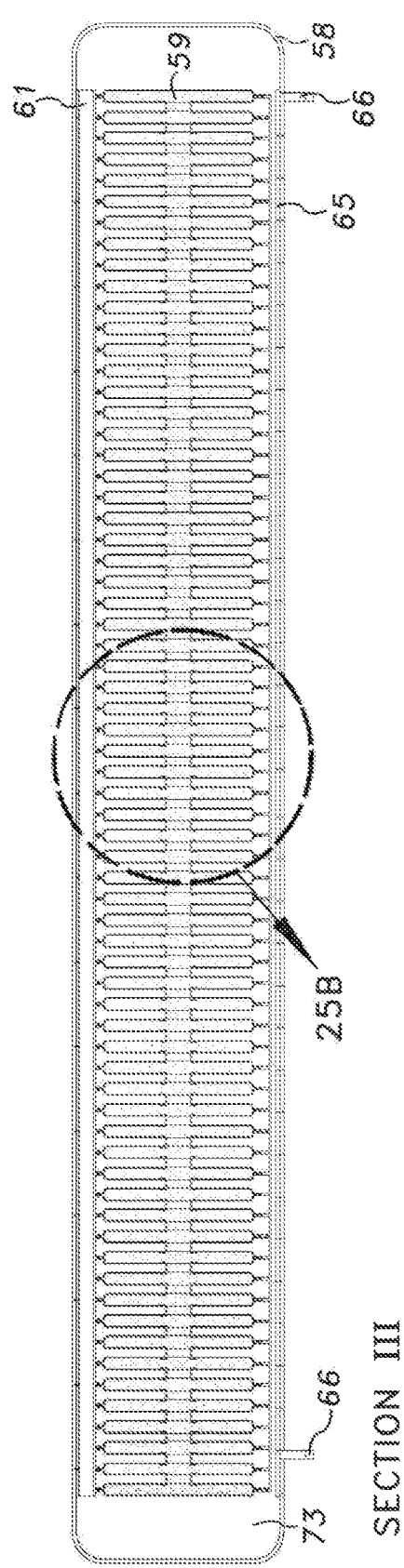
FIGS. 24-24A illustrate a schematic view of a storage reservoir for storing heated air.
Figure 24A:
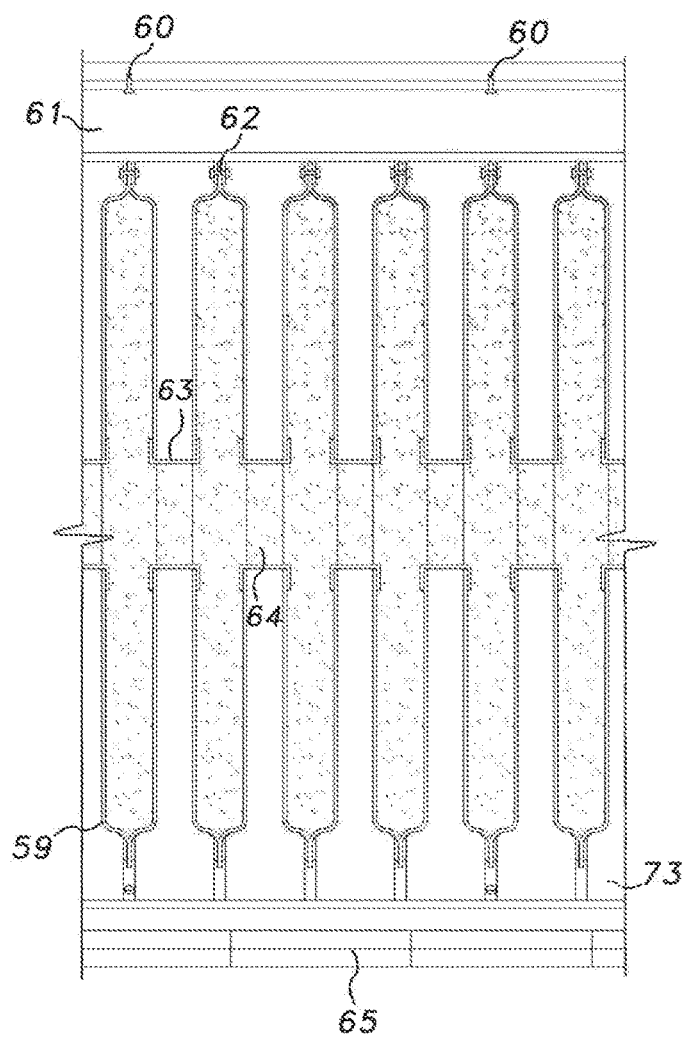

A storage reservoir (shown as 58 in FIGS. 6-10, 24 and 24A) for storing the heat generated in the heat generation encasements may include an outer surface made from a metal such as Aluminum. Inside, the storage reservoir may include metal blades that are made from a metal such as Aluminum (shown as 59 made in FIGS. 24 and 24A) and filled with paraffin PCM materials with a blend of Aluminum powder 64. This ensures that the blades 59 are connected together via a channel 63. The storage reservoir 58 may also include a controllable vent 65 for the transfer of warm air from the storage space to the interior of the building, which is opened and closed by the handle 66. When the vent is 65 closed, no warm air is transferred to the building, and the system will continue warming the storage reservoir. This can be used to store heat in the storage reservoir, such that any time heating is needed in the building, it could by supplied by opening the vent 65 and using the stored heat. The process of opening and closing the vent 65 can be electric and computerized. The blades 59 are connected to the outer shell of the storage reservoir 58 by means of a metal chassis 61. This connection is made through screws 62 on each blade. The metal chassis 61 connects to the ceiling through the joints 60. An empty space or gap 73 may separate the inside of the storage reservoir 58 from its outside. The gap can provide air circulation between the inner storage and the outer storage, as shown in FIGS. 24 and 24A. The heat stored in the storage reservoir during the sunlight can be used to provide heat for indoor spaces.

Figure 7:
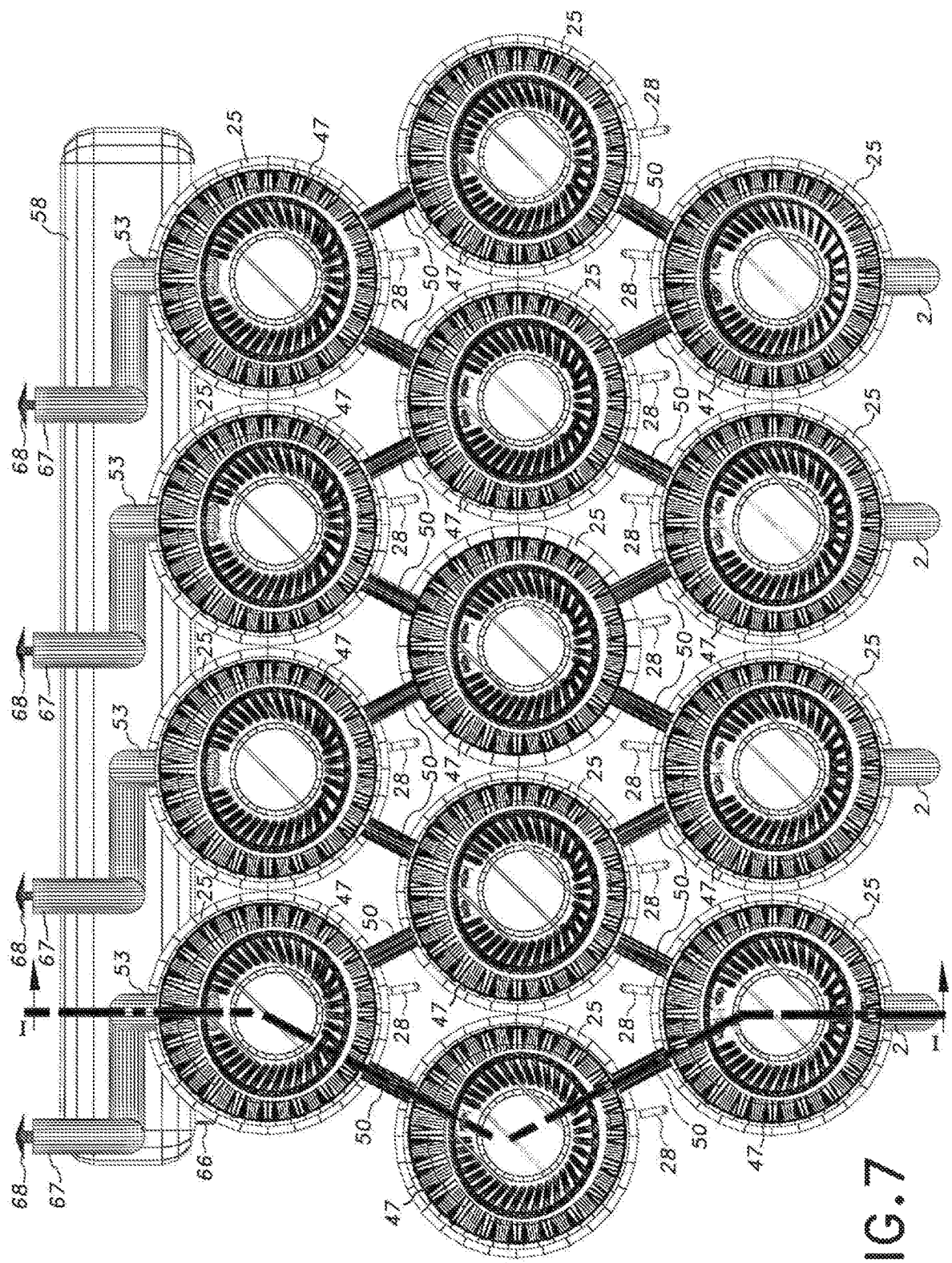
Figure 8:
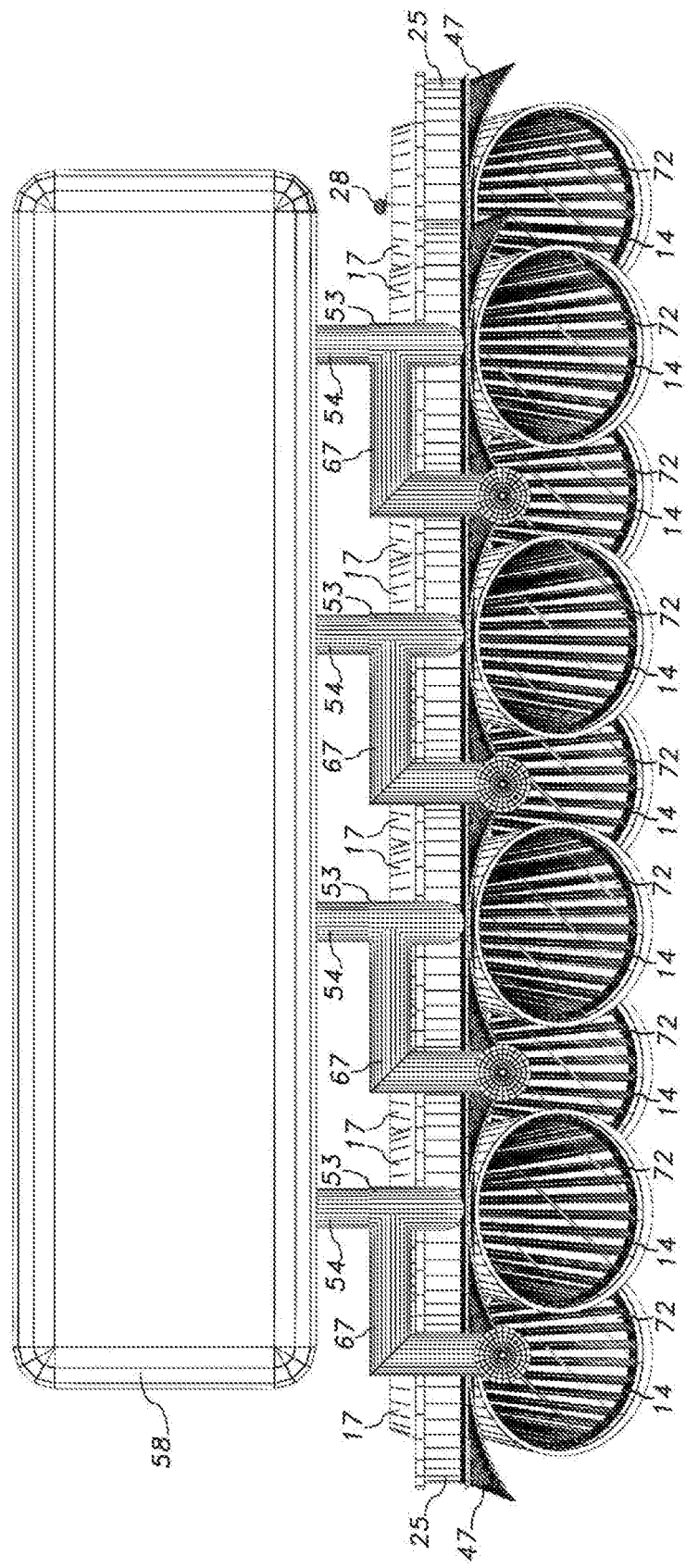

A set of connection pipes (2, 50, 52, 53, 54 and 67) are shown in FIGS. 5-9. In one implementation, one or more of these pipes include two layers, a metal layer (shown as 50 in FIG. 10A) and a plastic layer (shown as 51 in FIG. 10A). The metal layer helps provide structural and weight support for the heat generation encasements, while the plastic layer helps provide insulation for the heat and prevent it from being released through the metal layer of the pipes. The connection pipes 50 can transfer air between the heat generation encasements 72. The connection pipes 2 shown in FIG. 9 can function as input for receiving cold air from the indoor space into the heat generation encasements 72 of the solar window system and heating up the cold air in the encasements 72. The connection pipes 2 draw in the cold air into the solar window system. The connection pipes 53 (shown in FIGS. 7 and 8) can direct the heated air towards the storage reservoir. The plastic inner layer of the pipes 54 goes to the storage reservoir (FIG. 8), while the metal layer of the pipes 53 is directed toward the solar chimney 67 (FIGS. 7 and 9). In one implementation, the pipes 52 placed in the middle row (shown as 52 in FIG. 5), only have a structural purpose and do not perform transfer of heated air. Around each heat generation encasement 72, there is a circular unit which is a structural ring (shown as 25 in FIGS. 6-9). The metal layer of each pipe 50 is connected to this ring 25, which is responsible for providing structural and weight support to the heat generation encasements 72.

Figure 2:
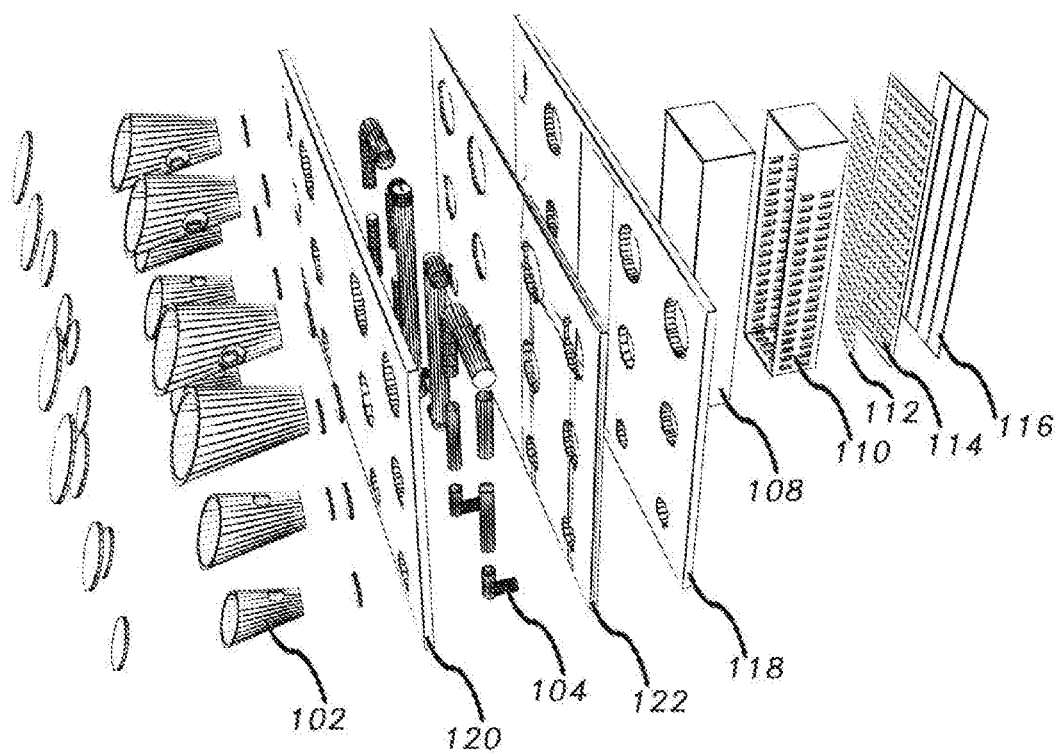
Figure 3:
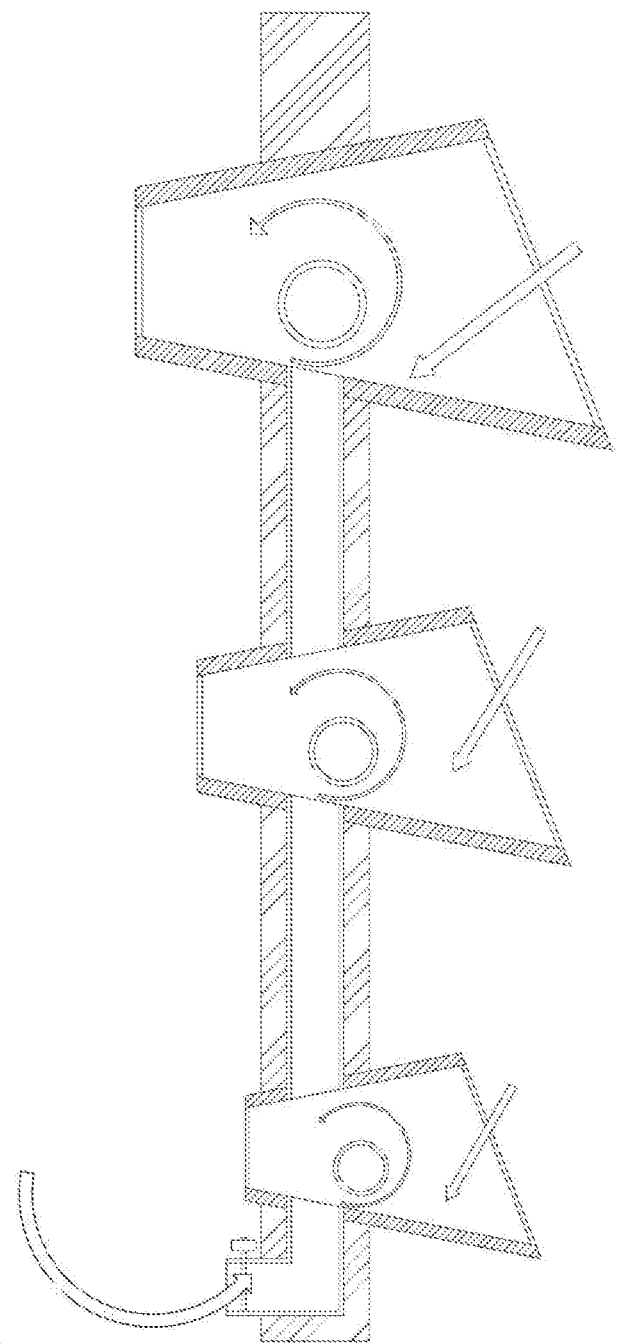
Figure 4:
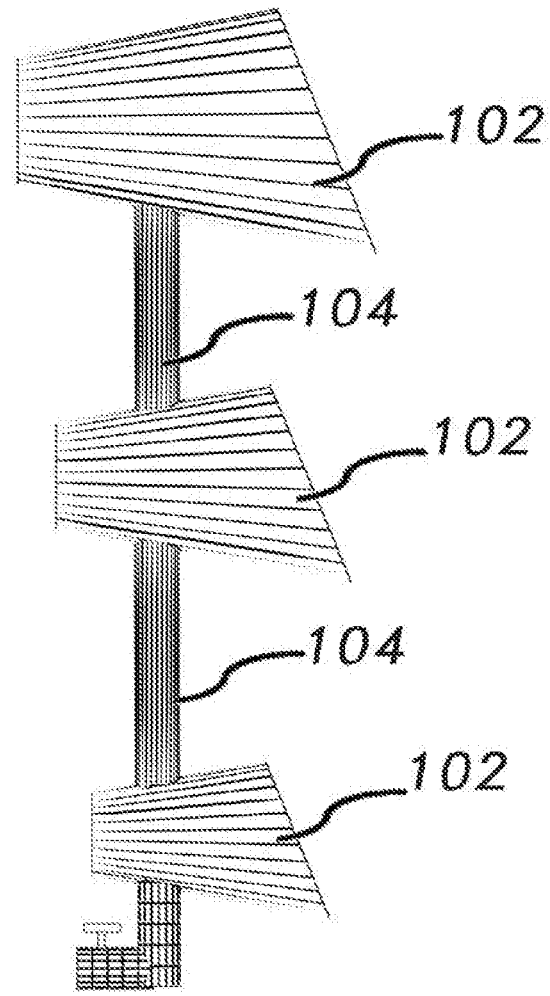

In one implementation, inside the structural circular ring 25, there is a moving plate (shown as 29 in FIGS. 10A, 10B, 10B-2). The moving plate 29 provides a housing for the movable vents 33 (FIGS. 10B-2, 15, 16, 19) when they are closed. Moreover, the moving plate 29 includes spur gears (Shown as 30 in FIGS. 10B-2, 15, 16) for connecting to the mechanism for moving the flexible solar panels. The moving plate 29 also includes a handle 28 (FIGS. 15, 16 and 19) for rotating the moving plate 29. By rotating the moving plate 29 about 13 degrees, the movable vents 33 on the inner side of the heat generation encasements 72 and the flexible solar panels 47 on the outer side of the heat generation encasements 72, can be opened and closed at the same time. The rotation degree of the handle 28 or moving plate 29 can vary from 13 degrees by changing the scale of gears. By increasing the rotation degree of the handle or moving plate, movable vents and flexible solar panels can move slowly.

An input control switch 4 shown in FIG. 9 can be installed at the entrance of the cold air into the system to prevent the cold air from entering the system, if desired by an operator.

Due to high density, cold air stays below the hot air in a vertical setup. The solar window system may include connection pipes 2 installed in the lowermost part of the window and in the indoor space to draw the cold air in the solar window system. Suction of the air is generated in the solar window system when the heated air with density lower than the cold air moves upwards.

Figure 19:
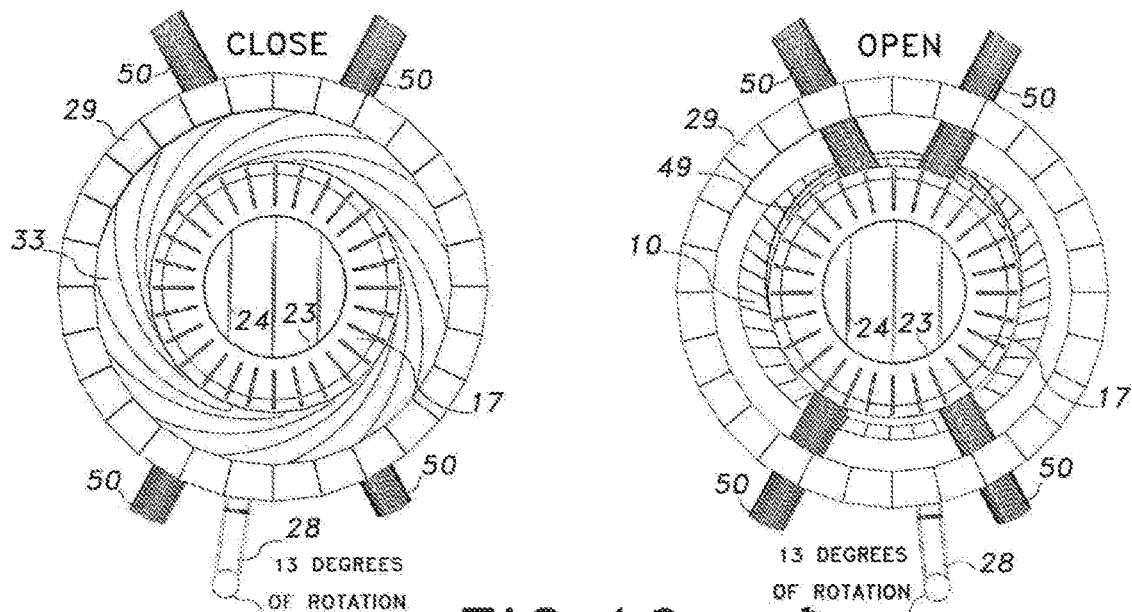
FIG. 19 is a schematic of heat generation encasements from inside the building when open and closed.
Figure 20:
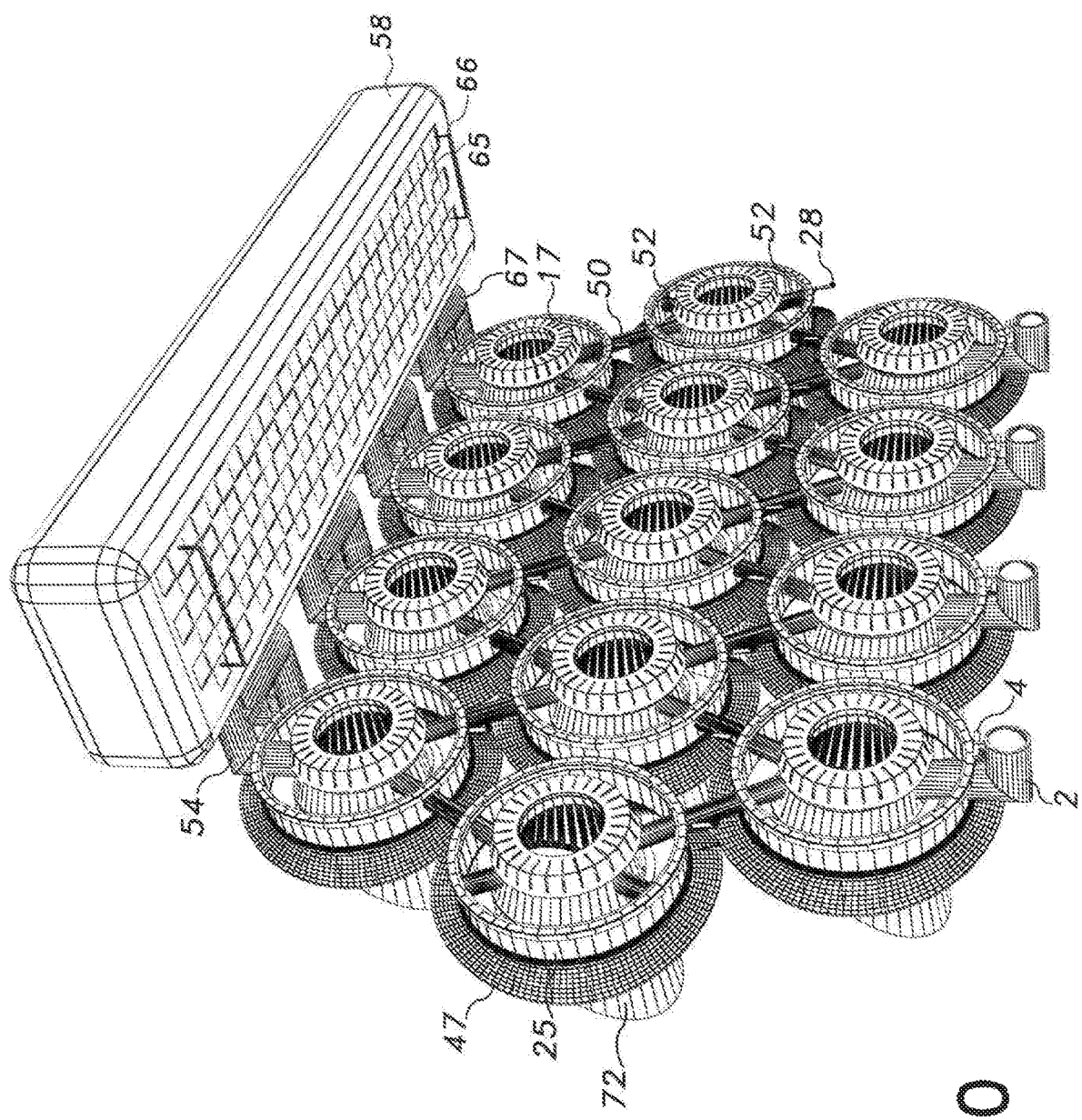
FIG. 20 is a schematic of a different view of the solar window system from inside building.
Figure 22:
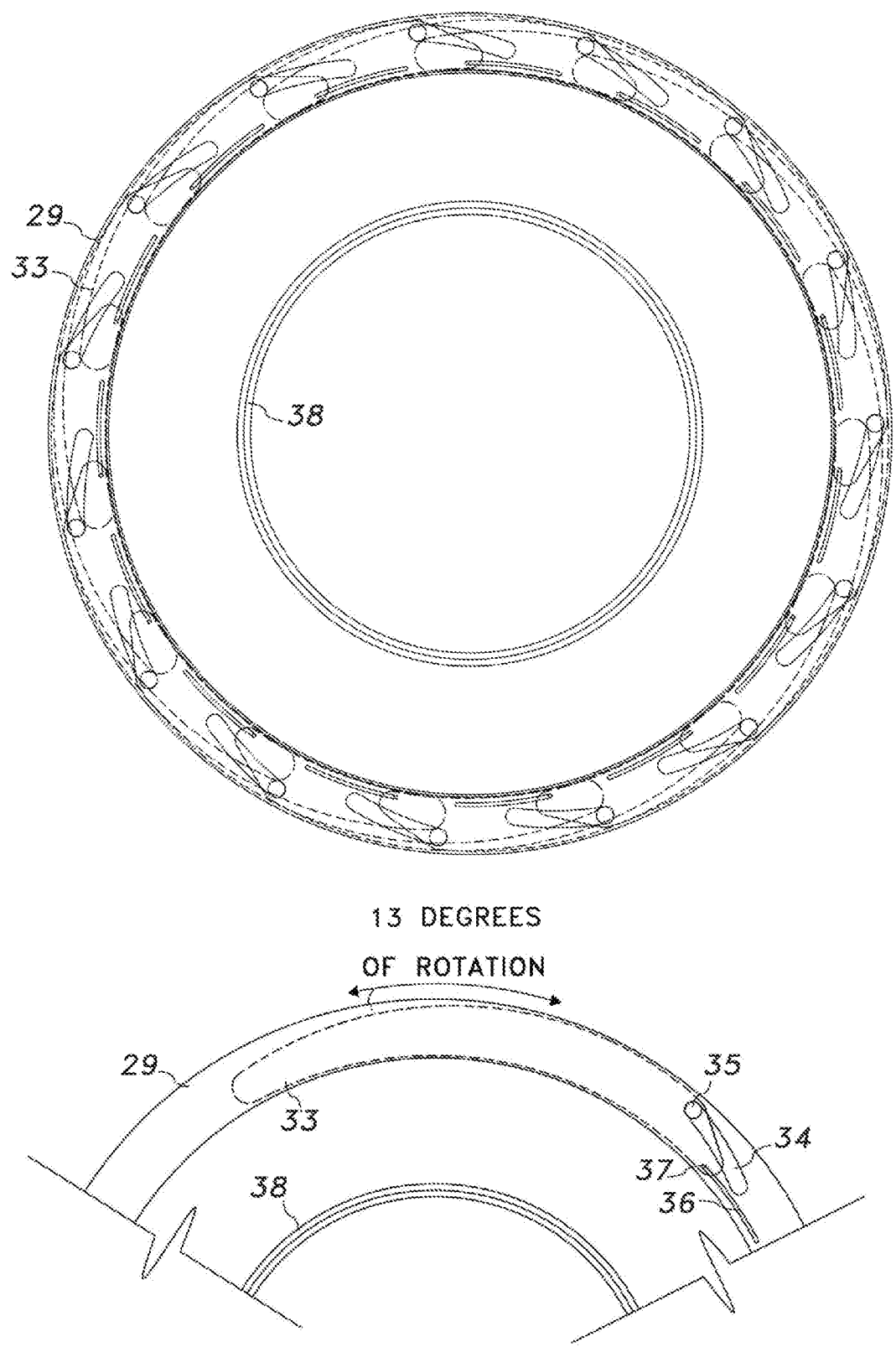

Each heat generation encasement 72 can have openings, as shown in FIGS. 19 and 10, for inserting the connection pipes 50. These openings can be on the top or bottom part of the encasements. The openings may be threaded such that the connection pipes 50 are screwed inside the opening. The connection pipes 50 can have threaded ends to be screwed into the threaded openings on the heat generation encasements 72. In one implementation, at the point of connection of the pipes 50 to the inner surface of the heat generation encasement 72, a thermal insulation layer (shown as 5 in FIG. 10B-3) is used around the pipe. This ensures that the area around the entrance to the pipe does not get heated and thus improves the flow of air.

In addition, the connection pipes 50 of FIG. 7 connect the heat generation encasements 72 to each other, for exchange of hot air heat among the heat generation encasements. The connection pipes 53 and 54 shown in FIGS. 6-9 transfer the heated air into the storage reservoir 58. The connection pipes 2, 53, 54 may have a larger diameter than pipes 50 such that a high volume of heated air can be easily transferred to the storage reservoir 58 (via 53 and 54) and a high volume of cold air can enter as input (via 2). A filter (e.g., a heat resistant filter) and a fan (e.g., a timer fan) can be installed at the entrance point of the storage reservoir 58 to filtrate the air. The fan can circulate the air and can be timed and programmable based on for example, air quality, the indoor current temperature and required temperature, the temperature trend in the geographical area, among other parameters.

Various impurities inside the building such as, for example, undesirable smells, dust, mold, chemicals, gases, germs and allergens can affect the air quality. The solar window system can draw the air from the indoor space, heat the air and filtrate the heated air prior to its entrance to the storage reservoir 58 via connection pipes 54 shown in FIGS. 9 and 10.

The fan (shown as 57 in FIG. 10C) can circulate the air inside the solar window system by passing it through a filter (shown as 56 in FIG. 10C) and the filter 56 can entrap the larger polluting particles in the air. The filter 56 can be replaceable and made from cotton, foam, fiberglass, or other synthetic or natural heat resistant fibers. High efficiency particulate air filters can be used to entrap 97 to 99 percent of particles larger than 0.3 microns. The filter may be a filter with Nano membrane. This filter can be easily detached from the pipe to be replaced or cleaned.

Figures 10D, 10E:
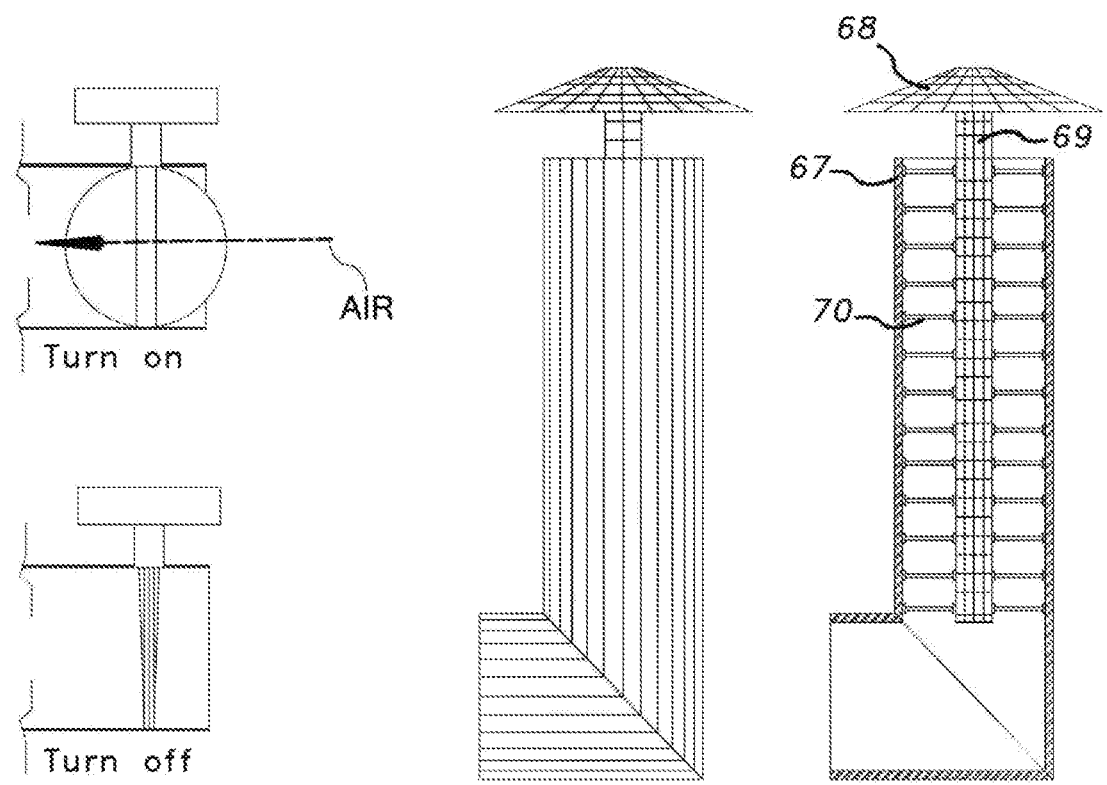
FIG. 10D is schematics of switches in the solar window system that control the flow of air in the system.
FIG. 10E is schematics of exhaust pipes in a solar chimney of the solar window system.

A storage control switch (shown as 55 in FIG. 10C) can be connected to the fan such that when no hot air is needed in the indoor space, the storage control switch can be turned off (FIG. 10D). In such case a chimney control switch can be turned on to start a solar chimney (shown as 71 in FIG. 10C) to direct the hot air to the outside. In some instances, a chimney control switch, an input control switch or a storage control switch can be automatically turned on or off based on other ones of the switches. For example, the storage control switch may be automatically turned off when the chimney control switch is turned on, or the storage control switch and the chimney control switch may be automatically turned off when the input control switch is turned off. In some other instances any of the switches may be controlled manually by an operator from the indoor space.

The solar window system also includes a solar chimney having a set of exhaust pipes, 67 as shown in FIGS. 5-10 and 10E that discharge the hot air from the indoor space to outside space (e.g., outside the building). For example, in the warm season when hot air is not needed, a storage control switch (55 in FIGS. 9, 10 and 10C) of the connection pipe attached to the storage reservoir can be turned off (54 in FIGS. 10 and 10C) and a chimney control switch of the exhaust pipes leading air towards outside space, can be turned on (71 in FIGS. 9, 10 and 10C). In such cases, the solar window system receives hot air from the indoor space and/or from the heat generation encasements and guides the hot air outside, which can be helpful in providing natural ventilation inside the building. In one implementation, the exhaust pipes 67 may be formed from metal materials and may have a metal bonnet (68 in FIGS. 9 and 10E). The bonnet and exhaust pipe can be heated up by the sunlight and a heated pipe and bonnet can provide faster discharge of the air from the indoor space to outside space. The bonnet 68 includes a base, such as a metal base 69 (FIG. 10E) which is connected through connectors 70 to the exhaust pipes 67.

As shown in FIGS. 9 and 10, the connection pipes 2 for inputting the cold air into the solar window system can be located at a lower part of the solar window system, because the cold air has a higher density compared to hot air. The input control switch shown in FIG. 10D can be installed at the location where cold air enters the system. In cases when no hot air, air filtration, or air conditioning is needed for the indoor space, the solar window system can be turned off. In such cases, the input control switch can be turned off to stop the cold air from entering the solar window system. The input control switch can be turned on and off manually by an operator or automatically, for example by a timer or based on a current temperature in the indoor space.

The input control switch (4 in FIGS. 9 and 10) when turned off can also stop air circulation inside the solar window system. In addition, a storage control switch 55 can be installed at the entrance point of the hot air to the storage reservoir 58 before the filter 56 and the fan 57. When no hot air is needed, and the solar window system is desired to be used as an air conditioner, the storage control switch can be turned off. In such cases, a chimney control switch 71 can be turned on such that the hot air from the heat generation encasements is directed to and released outside the building. The input control switch, storage control switch and chimney control switch can be made from high density plastic material. In addition, gaskets made from flexible plastic can be installed around a switch to prevent air leakage through the switch. The switches can be operated electronically using intelligent techniques.

The storage reservoir 58 of the solar window system can be placed on the building roof or on the ceiling of rooms inside the building. Due to upward movement of hot air, a roof/ceiling reservoir can be heated faster and more efficiently. The roof/ceiling reservoir does not obscure view from the window and does not occupy external wall surface. As a result, more wall space can be available for placing heat generation encasements on the wall.

Figure 23:
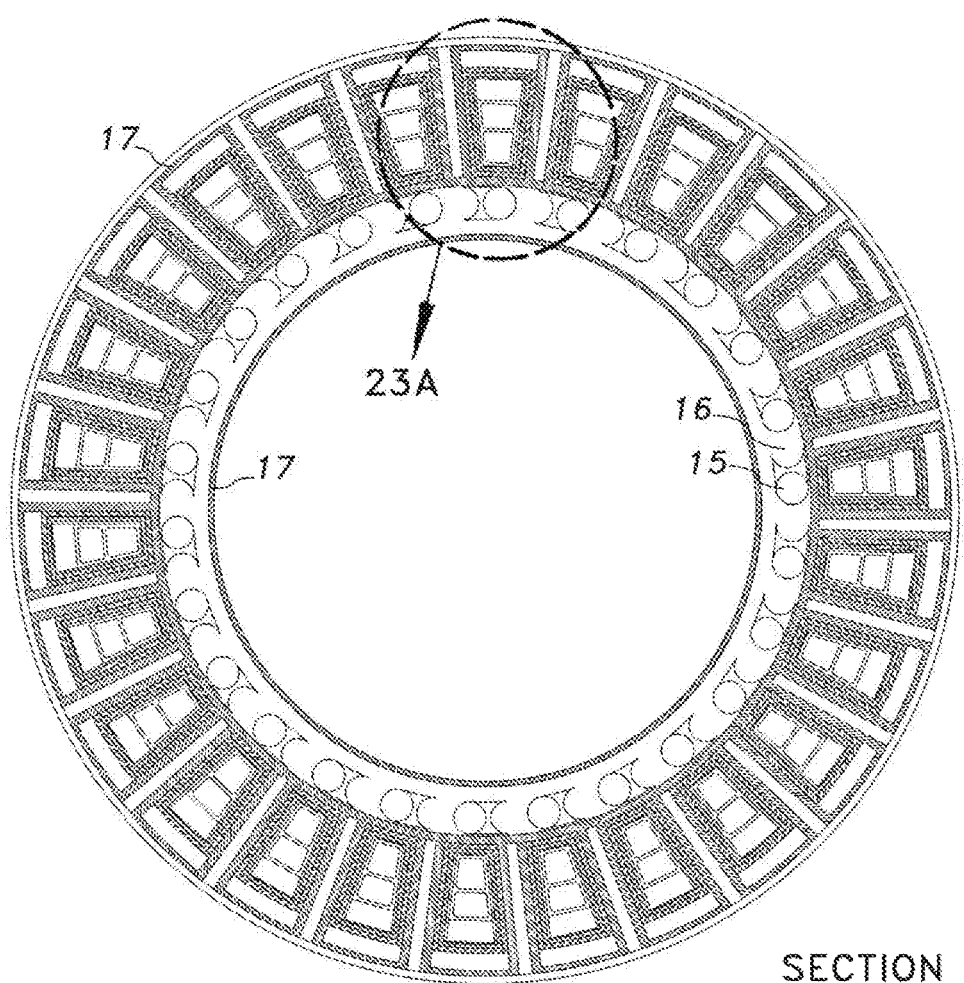
FIGS. 23-23A is a schematic of one view of a heat storage tank filled with phase-change materials and a battery for storing electric energy inside the heat storage tank.
Figure 23A:
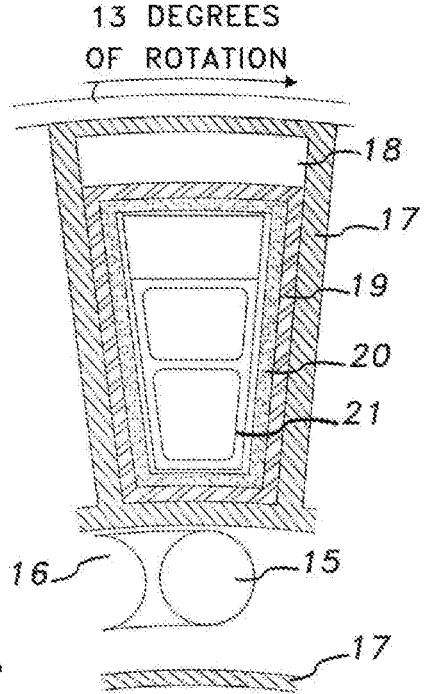

In the solar window system, pipes filled with PCM materials (shown as 14 in FIG. 10, FIG. 10A, 11) are located on the inner surface of the heat generation encasements 72 and on the metal layer of the thermoelectric sheets (shown as 6 in FIGS. 10B, 10B-1, and 11) to help heat the system. These pipes cause the air to heat up inside the heat generation encasements 72 and the heat storage tank (shown as 17 in FIGS. 9, 10, 18-20) connected to them. There is a heat storage tank 17 on each heat generation encasement 72 towards the interior of the building, which causes the interior space of the building to warm up. The area inside the heat storage tank (shown as 18 in FIG. 10A), like the pipes, is filled with PCM material. At the point of connection of the pipes with the heat storage tank (shown as 15 in FIGS. 10B, 10B-1, 23, and 23A), the connection between the pipe and the reservoir can be cut off when heat and heat storage are not required. By turning the heat storage tank 17, a metal layer (shown as 16 in FIG. 23, FIG. 23A), which is connected to the tank, closes the connection of the pipes with the heat storage tank, thus stopping the heating process of the tank. The heat storage tank 17 includes grooves (shown as 17 in FIG. 19) to have a greater cross-sectional area with air, thus facilitating the transfer of heat from the tank to the interior of the building. The process of disconnecting the connection between pipes and the heat storage tank 17 can be done manually or automatically.

Figure 13:
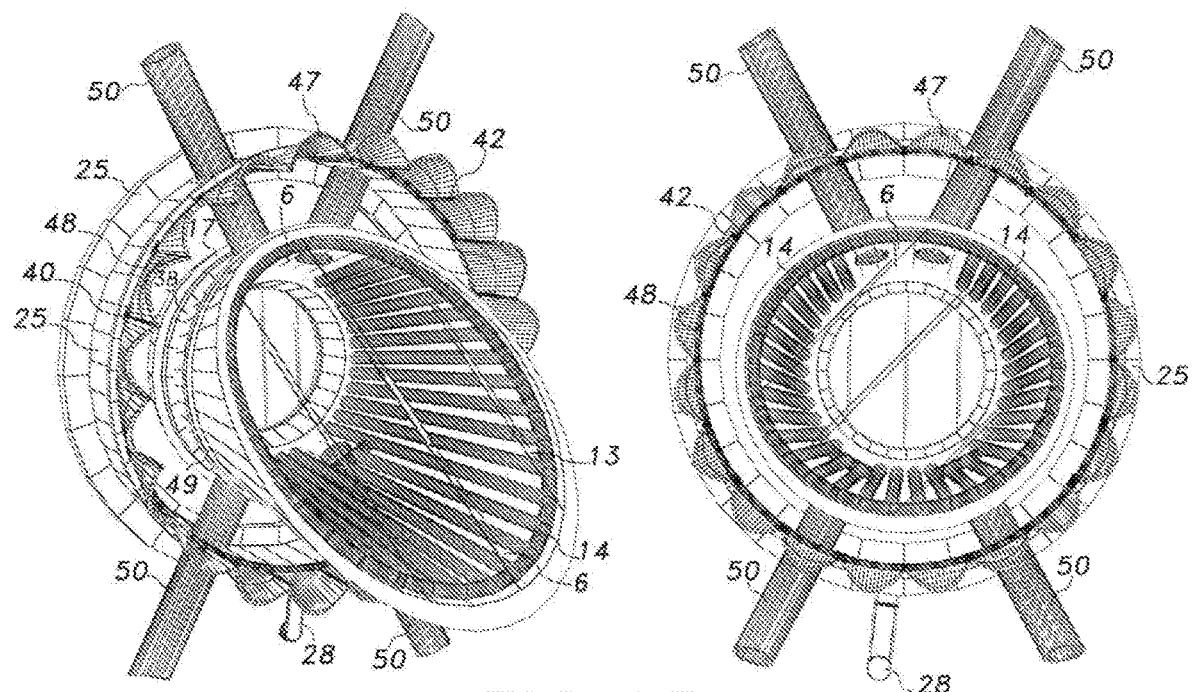

Another main component of the solar window system includes flexible solar panels with electrical power generation (shown as 47 in FIGS. 5-9). When there is no need for heat in the interior of the building, e.g., in the warm season, the solar system performs the operation of a solar chimney to release the warm air inside the building. For air conditioning to be done properly, fresh air should be replaced after the air is depleted. To achieve this, circular movable rings are located around the heat generation encasement 72, which help air enter into the building. In the outer part of these circular rings (i.e, the side facing outside of the building), flexible solar panels 47 with electrical power generation capabilities are used which can be opened (shown as 47 in FIG. 5) and closed (shown as 47 in FIG. 7). When the solar panels are closed, no air passes through the opening (shown as 47 in FIG. 11), but when open, the solar panels (shown as 47 in FIG. 14) lead air flow (e.g. to wind) into the direction of the interior of the building. Opening and closing these panels can occur through rods that are located inside the panels and gears that are positioned inside the system. The flexible solar panels, while being closed, meet and lock with a frame (shown as 49 in FIGS. 10A, 13, 14) on the heat generation encasement to prevent air from passage.

In one implementation, there is a circular structural ring (shown as 25 in FIGS. 6-9) around each movable ring which is responsible for providing structural and weight support to the heat generation encasements 72. A metal layer (shown as 27 in FIG. 10A), which is connected radially to the structural ring 25, is responsible for hiding gears of the moving mechanism of the solar system in the outside façade of the building.

Another main component of the solar window system is movable vents 33 (FIGS. 18 and 19) that are located on the inner part of the circular movable rings. The opening and closing of the flexible solar panels on the outer surface of the heat generation encasements and the movable vents 33 on the inner portion is carried out simultaneously through a handle (shown as 28 in FIGS. 18 and 19) located below each heat generation encasement inside the building. The degree with which the flexible solar panels and the movable vent open or close may vary in different weather conditions (FIGS. 11-14). For example, in cold months, the flexible solar panels and movable vent can become completely closed by rotating the handle 28 by 13 degrees (FIG. 6) to prevent air from entering into the interior of the building. In this case, because the flexible solar panel is bi-directional, power generation will not stop.

Figure 14:
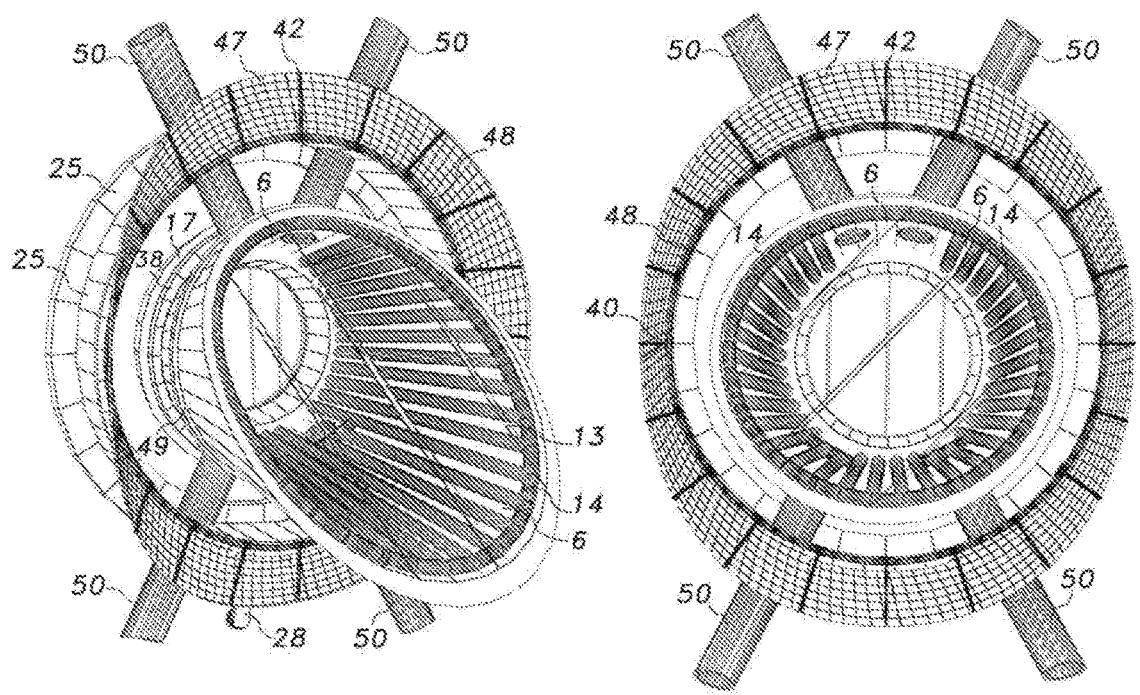
Figure 25:
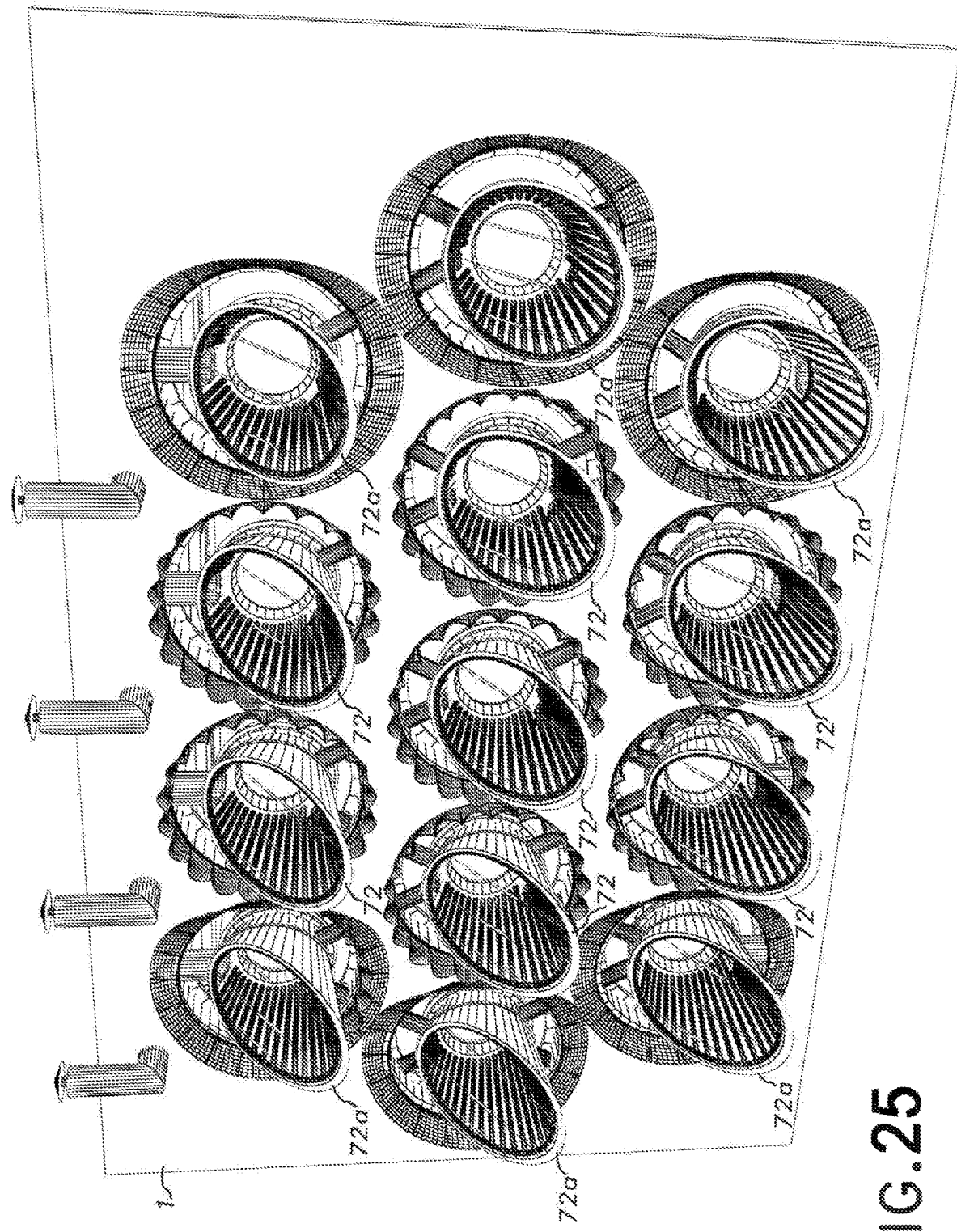
FIG. 25 illustrates the process of opening the flexible solar panels on the heat generation encasements.

In order to provide the most efficient and optimal climate control during hot and sunny days, the solar window system can perform two simultaneous functions: generate electricity through use of sunlight, and cool the interior of the building. To provide this, in one implementation, the thermoelectric heat generation encasements are divided into two groups. One group includes heat generation encasements that are primary used for generating electricity (shown as 72a in FIG. 25) and the other group, the remaining heat generation encasements 72 which provide heated or cool air as desired (FIG. 25) (by providing electric current to the thermoelectric cells). This may be done such that a portion of the heat generation encasements are solely responsible for producing electricity which in turn can provide cooling in the thermoelectric heat generation encasements 72. In one implementation, the flexible solar panels placed on thermoelectric chambers 72a are kept completely open to maximize the area for absorption of sunlight and thus power generation. To fully open the flexible solar panels, the handle 28 (FIG. 19) can be moved about 13 degrees. On the other hand, the flexible solar panels placed on heat generation encasements 72 may be kept semi-closed (FIG. 25) to create a shadow on the outer shell of the heat generation encasements 72 and thus help the cooling process of the building. To move the flexible solar panels to a semi-closed position, the handle 28 can be moved about 9 degrees. The functions of the heat generation encasements 72 and 72a (FIG. 25) can sometimes be contrary to each other. During warm nights, the flexible solar panels can be fully opened (FIGS. 5 and 14). By providing electric current to all thermoelectric heat generation encasements, the heat generation encasements can perform the cooling function through the outer shell (shown as 10 in FIG. 10A) by providing electricity to the thermoelectric sheet, and perform the heating function through the inner shell (shown in FIG. 10A). When one side of a thermoelectric panel is heated, it can generate electric power. On the other hand, when electricity is provided to a thermoelectric panel, it can generate heat on one side and cold on another side. This ability of thermoelectric panels is used in this system.

The movable vents 33 (FIGS. 21, 22, and 10B-2) include a plurality blades that are each attached to the movable plate 29 via a rod 35. Each of these movable blades 33 is also attached at a pivot point 37 to the structural ring 25. By moving the movable plate 29, the rod 35 connected to it moves the blades 33 around the axis of the pivot point 37. With the movement of the movable vents 33, the pivot point 37 becomes connected to the structural ring 27 through the gap 36, and the rod 35 moves inside the recess 34, which has a depth equal to half the thickness of the movable plate 29. The thickness of the various parts of the movable vents 33 is designed in a way to prevent the vents from colliding when being opened or closed. The movable vents 33 in the closed position (FIG. 19) move inside a frame on the heat generation encasements (shown as 38 in FIGS. 15, 16, and 21) to completely block entrance of air to the interior of the building. This frame is connected to the heat storage tank in the back of the heat generation encasements (FIG. 14).

Figure 17:
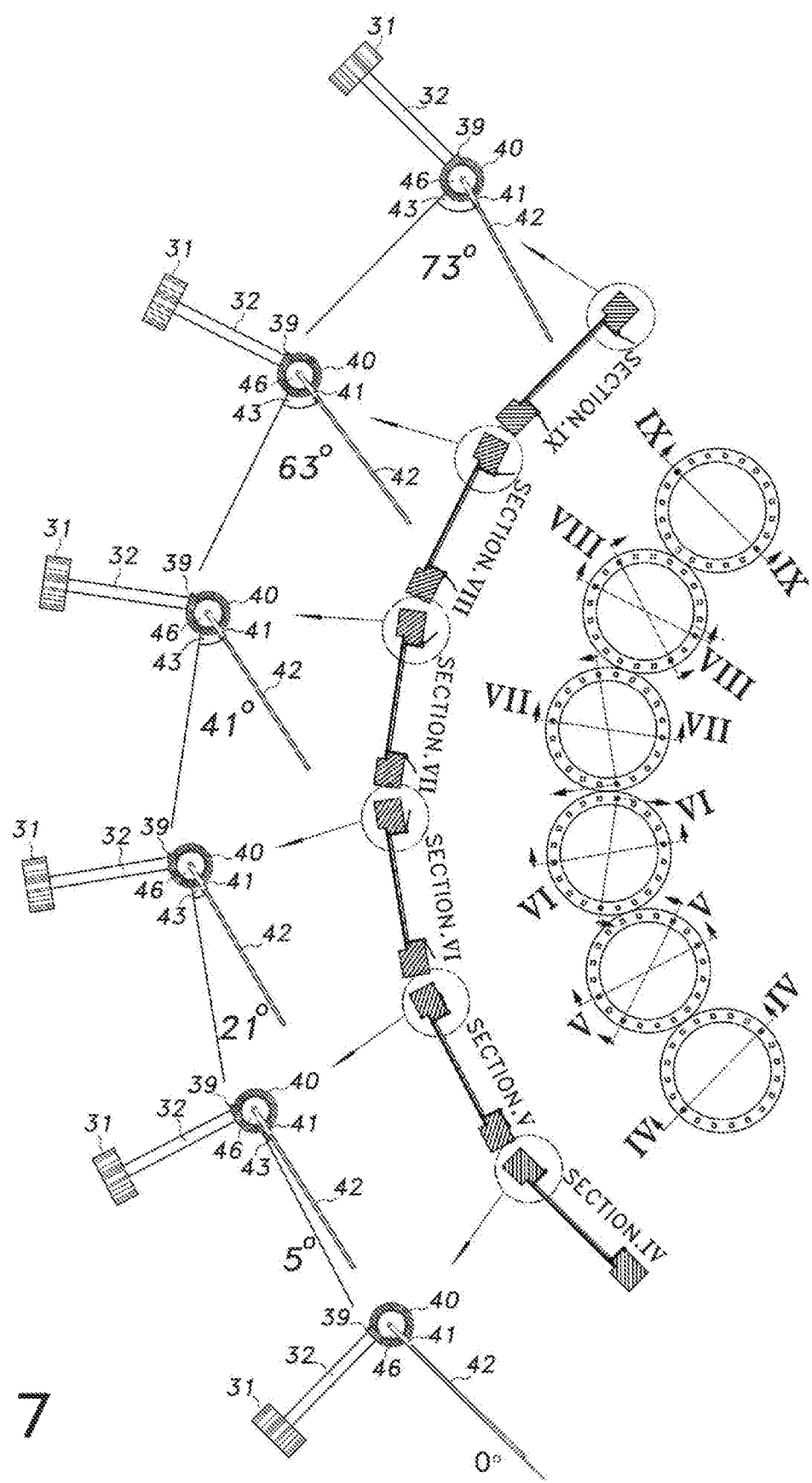
FIG. 17 illustrates angles of rods in the flexible solar panels of the heat generation encasement when the flexible solar panels are completely open.

By rotating the moving plate 29 by means of the handle 28, the spur gears connected to this plate move (30 in FIG. 10B-2, 15, 16). By rotating the gear 30, spur gears 31, the number of which equals the number of rods 42 in the flexible solar panels, start rotating. Each Spur gear is connected to a bar 32. By rotating the spur gear, the bar 32 connected to it starts rotating, which in turn causes a hypoid gear (shown as 39 in FIG. 15A) connected to the other side of the bar 32 to rotate. By turning gear 39, gear 40 is also rotated. The gear 40 is connected to the rods 42 inside the flexible solar panel, and the rotation of the rods brings the rods 42 and, as a result, moves the flexible sheet of the solar 47. The rod 42 connects to the gear 40 through the base 41. The maximum angle of opening of each rod 42 on the flexible solar panel is different (FIG. 17). In order to create a difference in the angel of opening of each rod 42, and because of the proportional geometry of the system, a small piece 43 is attached behind the base 41, which, after touching the wall, prevents further movement of the rod 42 (FIGS. 5, 14 and 16). The size of the piece 43 may be different for rod 42.

Because all rods 42 (FIGS. 14 and 15) are connected to each other through the flexible solar panels 47 and the gears 30, which are connected to the movable plate 29, when the small piece 43 (which is connected to one of the bases 41) hits the wall 1, it prevents the rod 42 from moving, thus preventing the rods 42 from opening. To solve this problem, a continuous rotation between the gear 40 and the base 41 is created (FIG. 15A) such that when the small piece 43 hits the wall 1, the gear 40 continues moving and does not prevent other gears from moving. In this case, the rod 42 does not move, but the gear 40 and all the gears connected to it (30, 31, and 39) continue to move. To create this continuous rotation, a small gear (shown as 45 in FIG. 15B) is used at the center of the gear unit 40. During the movement of the rod 42, one end of the base 41 fits into one of the gears of the gear 45 through a semi-flexible metal piece (shown as 44 in FIG. 15B). When the end of the base 41 stops moving as a result of the small piece 43 touching the wall, due to pressure, the semi-flexible metal piece 44 moves out of its place and into the next gear of the gear 45. In this manner, the end of the base 41, when placed in the desired angle does not prevent the gears and the base of the other rods from moving. In order to hide the gear 45 from view, a metal plate 46 can be placed over it (FIGS. 15A and 17). To make the solar panels open and close properly, a thin metal rim (shown as 48 in FIGS. 11-14) is located on the rotating axis of the flexible solar panels to maintain its structure. The opening and closing of the flexible solar panels and movable vents on both sides of the openings can be done automatically and/or electronically.

Figure 11:
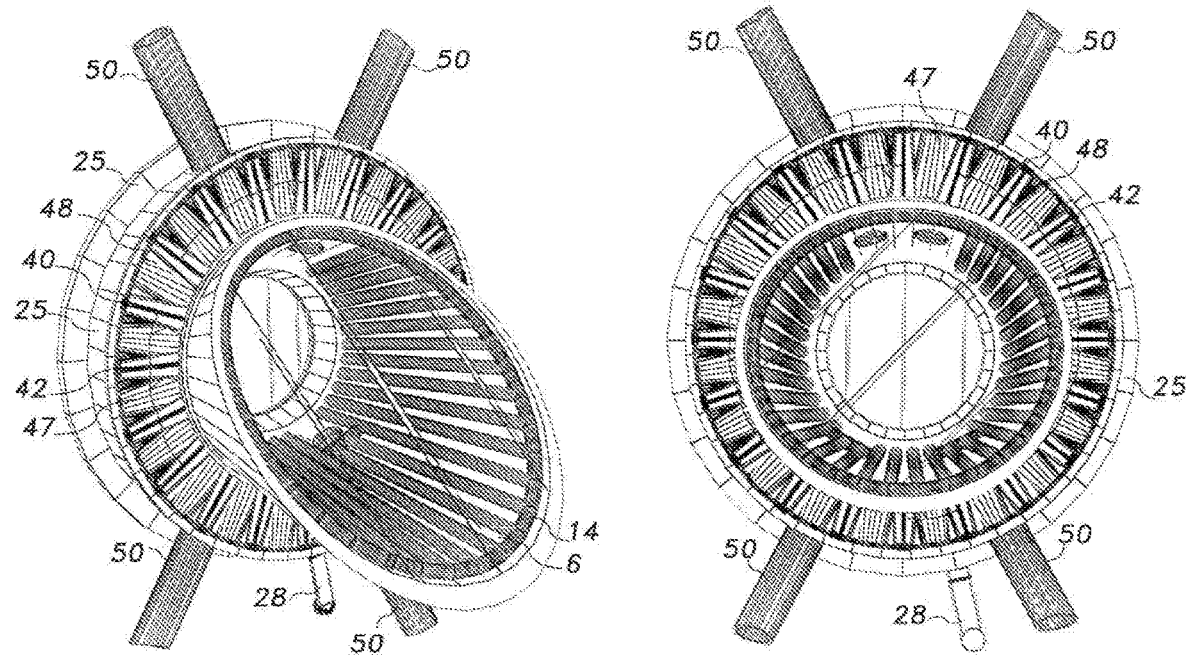
FIGS. 11-14 illustrate various stages of opening and closing flexible solar panels of a heat generation encasement that forms part of the solar window system.
Figure 12:
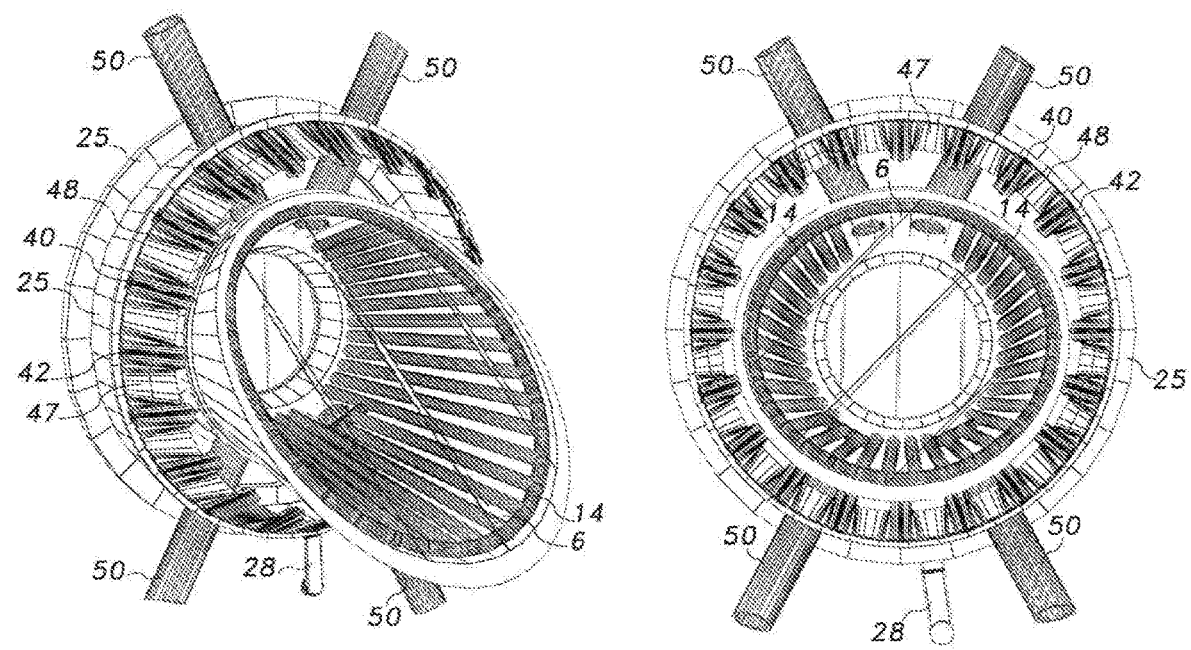

The flexible solar panels are capable of generating electrical energy from both sides and in both open and closed modes (shown as 47 in FIGS. 11 and 14). In one implementation, the electrical energy produced by the thermoelectric cylinders 72 (FIGS. 9 and 10) and solar panels 47 (FIGS. 5, 6, and 9) are stored inside batteries, such as a lithium iron phosphate battery cell (shown as 21, FIGS. 10A, 23, 23A). These batteries are placed inside the heat storage tank 27 (FIG. 9) behind each heat generation encasements. Batteries are connected through the wiring inside the enclosure (shown as 22 in FIG. 10B-3) with the thermoelectric plates and solar panels. Batteries 21 are located inside a dual-compartment of pressed plastics 19 and an insulating layer 20 so that the stored heat in the tank does not damage the battery.

Figure 29:
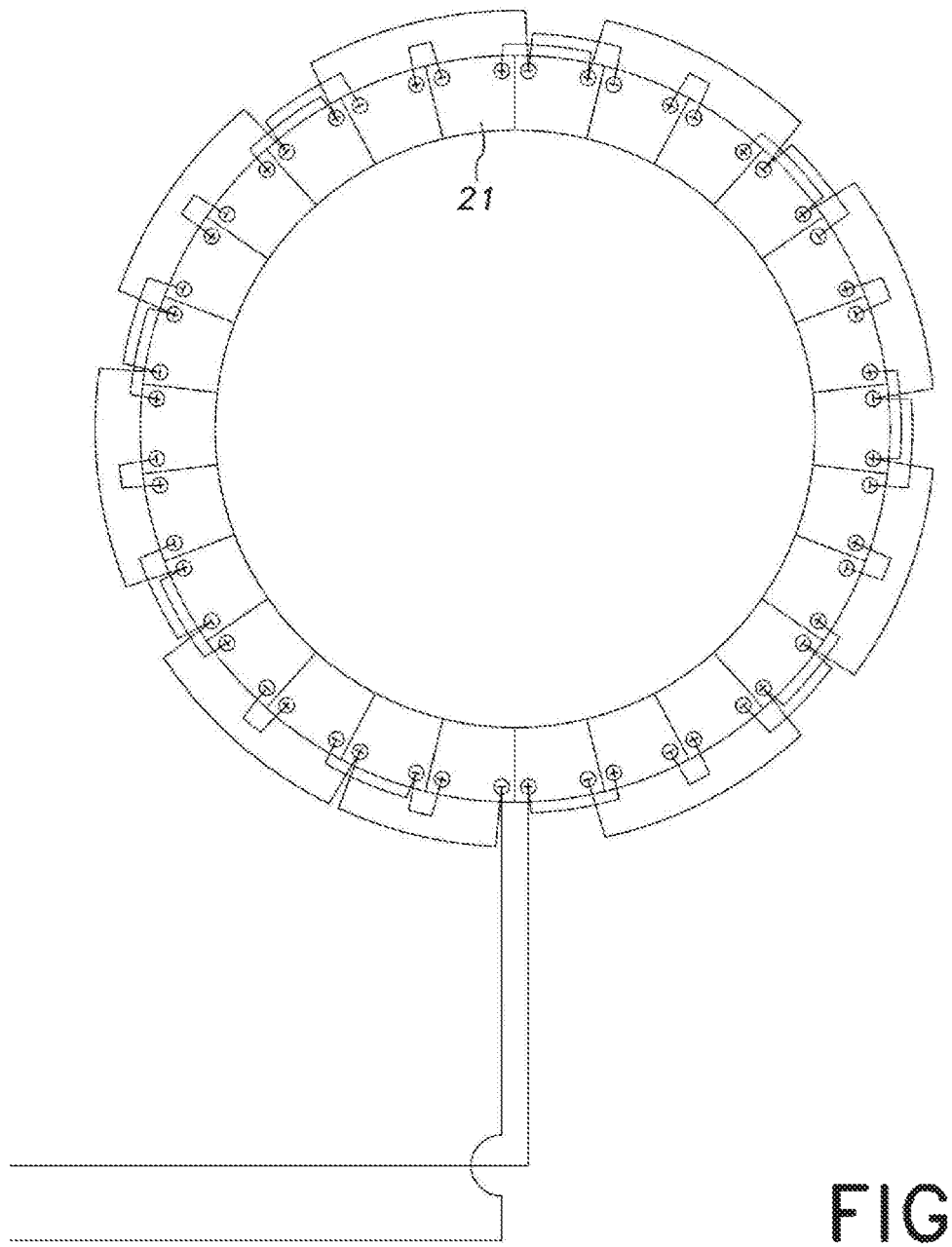
FIG. 29 illustrates electrical connections between the batteries of each heat generation encasement.

Flexible solar panels 47 and thermoelectric heat generation encasements 72 and 72a generate electrical energy. The generated energy from each heat generation encasement 72 is stored in 26 separate lithium iron phosphate battery cells. To collect all the voltages and battery currents, the batteries are connected together in series parallel configuration (FIG. 29). If the batteries are empty, the AC Generator can be used to provide the electrical energy for the solar window system.

Figure 26:
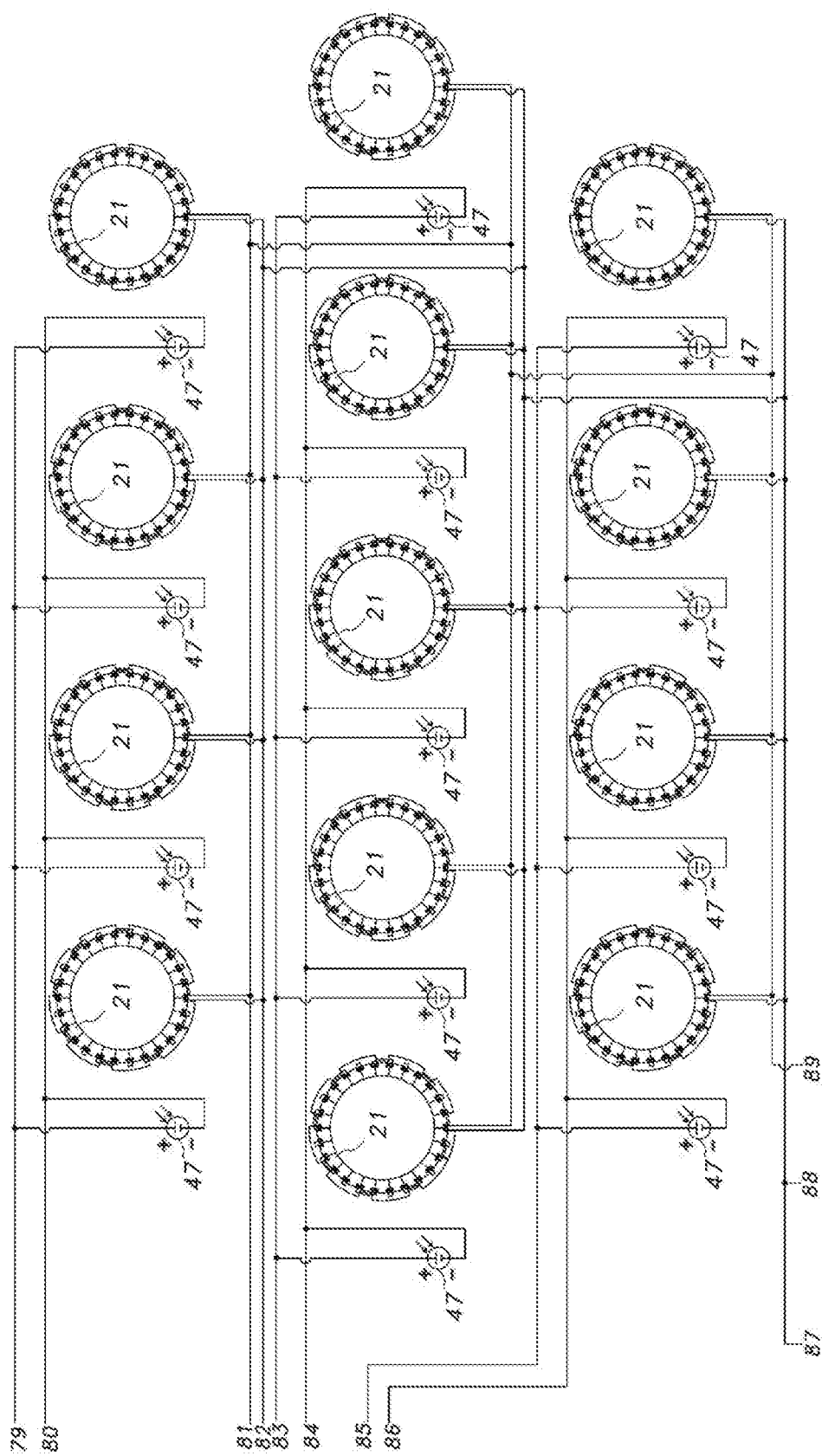
FIG. 26 illustrates electrical connections between the batteries for each heat generation encasement.
Figure 27:
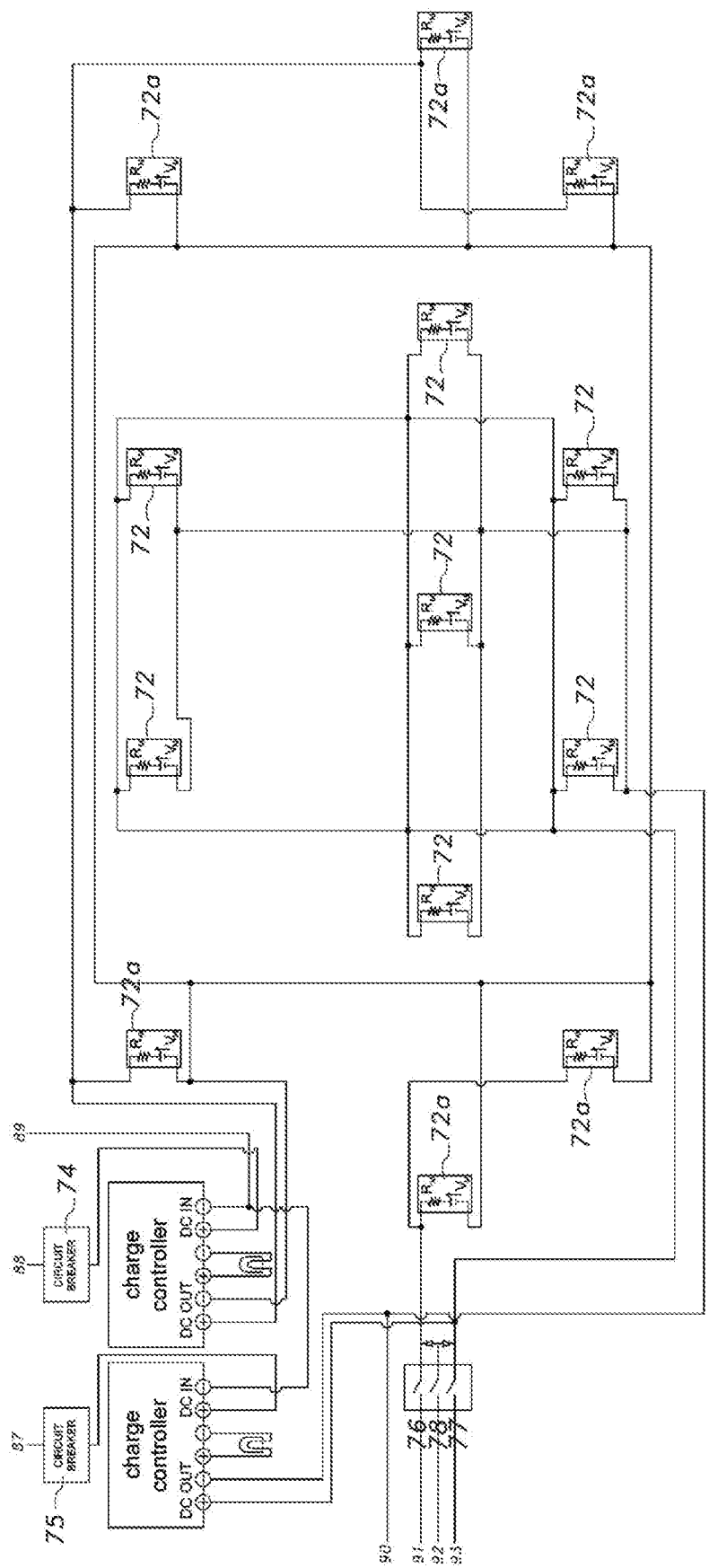
FIG. 27 illustrates electrical connections between the thermoelectric sheets of the heat generation encasements and the process of producing electric energy and heat and cold.
Figure 28:
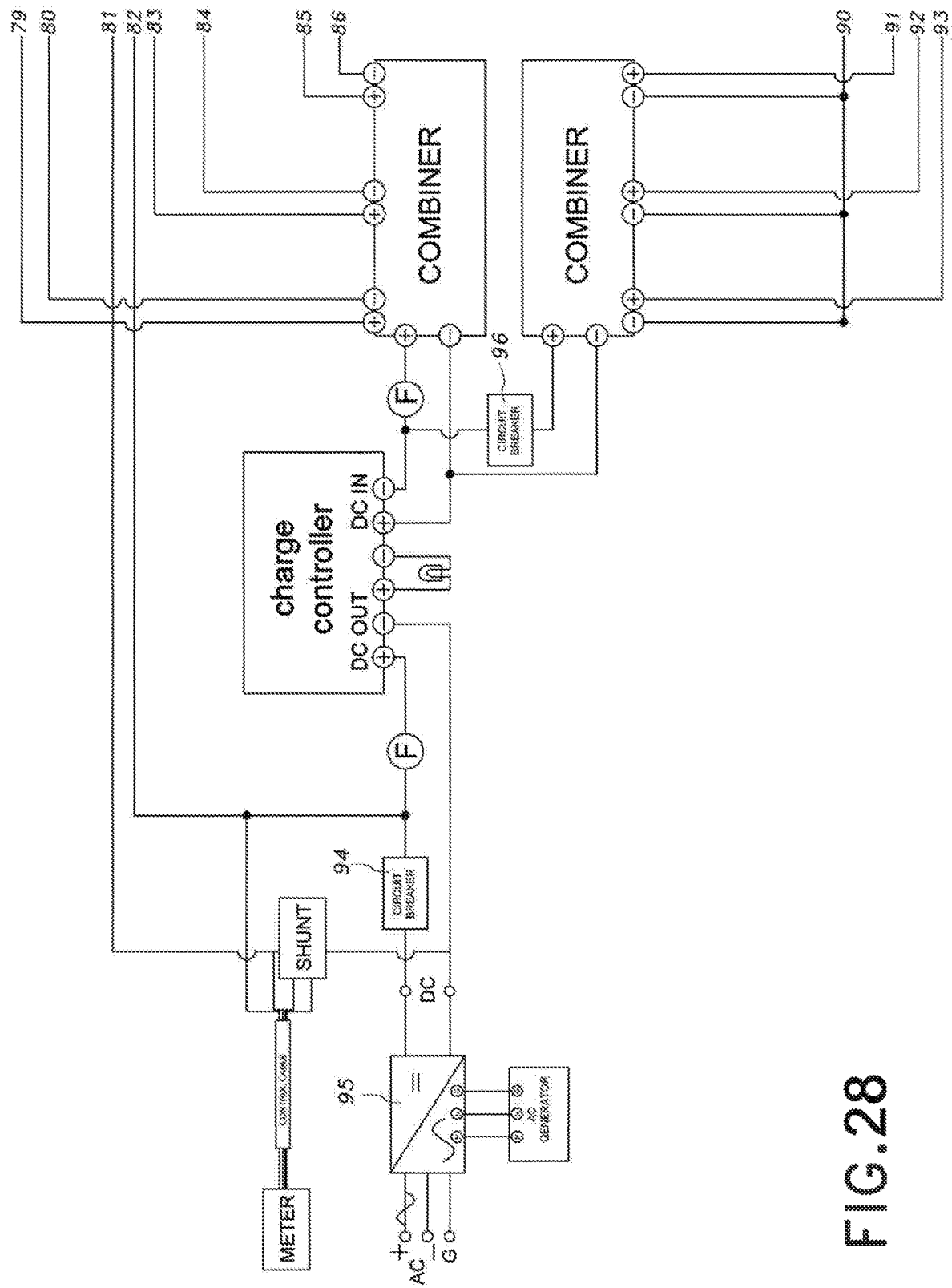
FIG. 28 illustrates electrical connections between the thermoelectric sheets, flexible solar panels, and batteries of the heat generation encasements.

In one implementation, the improved solar window system includes 13 heat generation encasements. In such a configuration, the solar window system includes 13 flexible solar panels 47 that are connected in parallel. These solar panels generate electrical energy and direct the generated energy to a combiner (FIGS. 26 and 28). From there, the combined electrical energy travels to a charge controller and connects to the batteries (FIG. 28). Before connecting the battery to an inverter (shown as 95 in FIG. 28) which converts the DC current to AC current, to keep the battery separate from the inventor a breaker (shown as 94 in FIG. 28) is used. Furthermore, to increase reliability at the entrance and exit of all thermoelectric cells, they are kept isolated by using 96 breakers. As shown in Table 1, by using a multi-position switch (shown as 76, 77, and 78 in FIG. 27), several different states can be considered for the thermoelectric heat generation encasements. First, by set the switch to position 76, the thermoelectric heat generation encasements 72a begin to generate electrical energy. In the second state, with the switch being in position 77, the thermoelectric circuits 72 start to generate electrical energy. In the third state, with the switch being in position 78, all heat generation encasements 72 and 72a begin to generate electrical energy. In the fourth state, when all the keys 76, 77 and 78 are disconnected, with connecting the breaker 74 (FIG. 26), thermoelectric heat generation encasements 72a begin to generate heat and cold air with electrical energy. In the fifth state, by connecting the breaker 75, only thermoelectric heat generation encasements 72, begins to produce cold and heated air with electrical energy. In the sixth state, by connecting the breakers 74 and 75 together, by receiving electrical energy all the heat generation encasements 72 and 72a generate heat and cold air. In the seventh state, by placing the switch in position 76 and connecting the breaker 75, the heat generation encasements 72a begins to generate electrical energy, and the heat generation encasements 72 receive the electrical energy and start to generate cold and heated air. In the eighth state, by placing the switch in position 77 and connecting breaker 74, thermoelectric heat generation encasements 72 produce electric energy and thermoelectric heat generation encasements 72a receive the electrical energy and generate heat and cold air. Therefore, it should be noted that, as illustrated in Table 1, if the switch is in positions 76, 77, or 78 are connected, two other keys are disconnected.

eration encasements and flexible solar panels, providing cool air ventilation through openings around the of the heat generation encasements, and providing air conditioning by the solar chimneys in hot weather. The improved solar window system can provide heating to the interior of the building in three ways. One way is through pipes filled with phase-change material which are included inside each heat generation encasement. The generated heat is then transmitted to a heat storage tank positioned behind each heat generation encasements, which is also filled with phase-shifting material. The heat is then released from the heat storage tanks into the interior of the building. A second manner in which the system generates heat is by heating the air inside each heat generation encasement due to its internal metal shell. The heated air is then transferred to storage reservoir filled with paraffin and aluminum powder and from there it is released into the interior of the building. This air may pass through a purifier filter before entering the reservoir. This storage reservoir may be placed on the roof of the building. The third way in which the system provides heat is by using thermoelectric sheets. During sunlight, the thermoelectric metal layer causes the air inside the heat generation encasement to heat up. Furthermore, the difference in temperature between the interior and outer layers of the thermoelectric produces electrical energy. When there is no sun, by returning the stored electrical energy to thermoelectric, the internal metal layer is heated, thus providing heat in the improved solar window system.

The disclosed improved solar window system draws in the air as input, heats up and filters the air and returns the air to the environment as output. The air ventilation by the solar window system can purify the air in polluted areas and help reduce allergies and lung problems due to air pollution.

The process of heat generation by the disclosed improved solar window system includes, multiple heat generation encasements which are installed in the building as windows or sunlight absorption components as shown as item 72 in FIGS. 5, 6, 8, and 9. In addition to heat, these heat generation encasements provide natural light for lighting the indoor space, generate electricity and provide ventilation.

The disclosure provides multiple advantages such as a structure for providing a combination of controlled light and

TABLE 1

| position | Thermoelectric | Provide heat and cold | Electricity generation | Key number 76 | Key number 77 | Key number 78 | Circuit Breaker 74 | Circuit Breaker 75 |
|---|---|---|---|---|---|---|---|---|
| 1 | 72 |  |  | on | off | off | off | off |
|  | 72a |  | • |  |  |  |  |  |
| 2 | 72 |  | • | off | on | off | off | off |
|  | 72a |  |  |  |  |  |  |  |
| 3 | 72 |  | • | off | off | on | off | off |
|  | 72a |  | • |  |  |  |  |  |
| 4 | 72 |  |  | off | off | off | on | off |
|  | 72a | • |  |  |  |  |  |  |
| 5 | 72 | • |  | off | off | off | off | on |
|  | 72a |  |  |  |  |  |  |  |
| 6 | 72 | • |  | off | off | off | on | on |
|  | 72a | • |  |  |  |  |  |  |
| 7 | 72 | • |  | on | off | off | off | on |
|  | 72a |  | • |  |  |  |  |  |
| 8 | 72 | • |  | off | on | off | on | off |
|  | 72a |  | • |  |  |  |  |  |

The disclosed solar window system may have main functionalities such as, providing natural light for indoor spaces, providing filtered heated air in cold weather, producing electrical energy through thermoelectric heat gen- heat from solar energy such that each of the solar light, the solar heat, generating electricity and providing ventilation can be used without having negative effect on each other. The disclosed improved solar window system provides low cost heat and air conditioning and prevents air pollution caused by using fossil fuels. This system is part of the building and does not require extra space. The disclosed improved solar window system can be used in every season as a heater, air conditioner, solar chimney, air purifier and generator of electricity.

The separation of various system components in the examples described above should not be understood as requiring such separation in all examples, and it should be understood that the described components and systems can generally be integrated together in a single packaged into multiple systems.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations for the purpose of streamlining the disclosure. This method of disclosure is not to be interpreted as reflecting an intention that the claimed implementations require more features than are expressly recited in each claim. Rather, as the following claims reflect, inventive subject matter lies in less than all features of a single disclosed implementation. Thus the following claims are hereby incorporated into the Detailed Description, with each claim standing on its own as a separately claimed subject matter.

What is claimed is:

1. A solar window system for a building comprising:
    a plurality of heat generation encasements, wherein air inside each heat generation encasement is heated by solar energy;
    a plurality of circular movable rings, each one of the plurality of circular movable rings positioned around one of the plurality of heat generation encasements, wherein an outer part of each one of the plurality of circular movable rings is made from a flexible solar panel and when opened, the flexible solar panel leads air flow into an interior of the building;
    one or more pipes filled with phase-change materials (PCM) attached to each heat generation encasement, wherein the PCM is heated by solar energy;
    one heat storage tank for each heat generation encasement for receiving heat from the PCM material of the one or more pipes, and releasing the heat inside the building when needed;
    a storage reservoir located on an upper portion of the solar window system for storing the heated air from inside each heat generation encasement, releasing the heated air into the building when needed; and
    a set of connection pipes, wherein the set of connection pipes are configured to:
        draw cold air from an indoor space inside the building into the plurality of heat generation encasements, and
        transfer the heated air from the plurality of heat generation encasements to the storage reservoir,
    wherein:
        each heat generation encasement includes at least one thermoelectric sheet for generating electricity,
        at least one of the plurality of heat generation encasements includes two glass sheets each covering one of two ends of the at least one of the plurality of heat generation encasements, and
        one of the two glass sheets faces sunlight with a predefined angle to provide maximum absorption of solar energy for heating the air inside the heat generation encasement.

2. The solar window system of claim 1, wherein the storage reservoir includes:
    an outer storage made from aluminum; and
    an inner storage filled with a mixture of paraffin and aluminum powder as a type of PCM to store the heated air, wherein an empty space separates the inner storage and the outer storage.

3. The solar window system of claim 2, further comprising:
    a fan installed at an entrance point to the storage reservoir where the heated air from the plurality of heat generation encasements enters the storage reservoir via the connection pipes, such that the fan provides circulation of the heated air to the indoor space inside the building.

4. The solar window system of claim 3, further comprising:
a filter installed at the entrance point to the storage reservoir in front of the fan, such that the heated air circulated by the fan passes through the filter and purifies prior to entering the storage reservoir.

5. The solar window system of claim 1, wherein the heat storage reservoir is filled with PCM.

6. The solar window system of claim 1, wherein at least one of the plurality of heat generation encasements is a cylinder and the cylinder includes
an inner surface and an outer surface made from thermoelectric sheets.

7. The solar window system of claim 6, wherein the two glass sheets are anti-reflective glass sheets and provide light to the indoor space.

8. The solar window system of claim 1, wherein the connection pipes include an outer metal layer.

9. The solar window system of claim 1, further comprising at least a pack of one or more batteries for each heat generation encasement for storing the generated electricity.

10. The solar window system of claim 1, wherein the at least one pack of one or more batteries are inside the heat storage tank.

11. The solar window system of claim 1, wherein the flexible solar panel functions as a movable vent.

12. The solar window system of claim 1, further comprising:
a solar chimney including a plurality of exhaust pipes and a chimney control switch, wherein when the chimney control switch is turned on, the plurality of exhaust pipes are opened and the heated air from the plurality of heat generation encasements is released outside the building.

13. The solar window system of claim 12, further comprising:
a storage control switch wherein when the storage control switch is turned off, the transfer of the heated air from the plurality of heat generation encasements to the storage reservoir is stopped.

14. The solar window system of claim 13, wherein the storage control switch is automatically turned off when the chimney control switch is turned on.

15. The solar window system of claim 1, wherein a connection between the one or more pipes and the heat storage reservoir can be cut off when needed.

16. The solar window system of claim 1, further comprising a structural ring for each heat generation encasement for providing structural support to each heat generation encasement.

* * * * *